United States Patent
Kunihiro et al.

(10) Patent No.: US 9,838,068 B2
(45) Date of Patent: Dec. 5, 2017

(54) TRANSMITTER/RECEIVER APPARATUS, TRANSMITTER APPARATUS AND TRANSMITTING/RECEIVING METHOD

(71) Applicant: NEC CORPORATION, Tokyo (JP)

(72) Inventors: Kazuaki Kunihiro, Tokyo (JP); Shinichi Hori, Tokyo (JP)

(73) Assignee: NEC CORPORATION, Minato-ku, Tokyo (JP)

(*) Notice: Subject to any disclaimer, the term of this patent is extended or adjusted under 35 U.S.C. 154(b) by 0 days.

(21) Appl. No.: 15/027,767

(22) PCT Filed: Oct. 15, 2014

(86) PCT No.: PCT/JP2014/005216
§ 371 (c)(1),
(2) Date: Apr. 7, 2016

(87) PCT Pub. No.: WO2015/059901
PCT Pub. Date: Apr. 30, 2015

(65) Prior Publication Data
US 2016/0248470 A1    Aug. 25, 2016

(30) Foreign Application Priority Data
Oct. 22, 2013    (JP) .................... 2013-218937

(51) Int. Cl.
*H04L 5/16*    (2006.01)
*H04B 1/44*    (2006.01)
(Continued)

(52) U.S. Cl.
CPC .............. *H04B 1/44* (2013.01); *H03F 3/195* (2013.01); *H03F 3/213* (2013.01); *H03F 3/217* (2013.01);
(Continued)

(58) Field of Classification Search
CPC .......... H04B 1/40; H04B 3/23; H04L 27/2601
(Continued)

(56) References Cited

U.S. PATENT DOCUMENTS

| 2006/0280314 A1* | 12/2006 | Okada ................ H03F 3/217 381/71.1 |
| 2007/0109048 A1* | 5/2007 | Inoue ................ H03F 3/217 330/200 |
| 2015/0381039 A1* | 12/2015 | Hari ................ H02M 1/15 323/271 |

FOREIGN PATENT DOCUMENTS

| JP | 04-373317 A | 12/1992 |
| JP | 2005-64662 A | 3/2005 |

(Continued)

OTHER PUBLICATIONS

International Search Report of PCT/JP2014/005216 dated Jan. 20, 2015.
Written Opinion of PCT/JP2014/005216 dated Jan. 20, 2015.

*Primary Examiner* — Khai Tran
(74) *Attorney, Agent, or Firm* — Sughrue Mion, PLLC

(57) ABSTRACT

A transmitter/receiver apparatus including: a transmitter/receiver terminal; a switching amplifier that includes a low-side switching element connected between a ground terminal and a pulse output terminal and a high-side switching element connected between the pulse output terminal and a power supply terminal and that outputs a pulse signal from the pulse output terminal; a filter that passes therethrough and outputs as a transmitted signal a predetermined frequency component of the pulse signal from a transmitter terminal; and a transmit/receive switch unit that switches the connection status between the transmitter/receiver terminal and the transmitter terminal and also switches the connection status between the transmitter/receiver terminal and a receiver terminal. During receiving, on the basis of the
(Continued)

connection status between the transmitter/receiver terminal and the transmitter terminal, the low-side and high-side switching elements are fixed to conductive and non-conductive states, respectively, to non-conductive and conductive states, respectively, or both to non-conductive states.

18 Claims, 14 Drawing Sheets

(51) Int. Cl.
| | |
|---|---|
| H03F 3/217 | (2006.01) |
| H03F 3/195 | (2006.01) |
| H03F 3/213 | (2006.01) |
| H03F 3/24 | (2006.01) |
| H04B 1/3827 | (2015.01) |
| H04L 27/36 | (2006.01) |
| H04L 27/38 | (2006.01) |

(52) U.S. Cl.
CPC ......... *H03F 3/2171* (2013.01); *H03F 3/2173* (2013.01); *H03F 3/245* (2013.01); *H04B 1/3833* (2013.01); *H04L 27/36* (2013.01); *H04L 27/38* (2013.01); *H03F 2200/171* (2013.01); *H03F 2200/294* (2013.01); *H03F 2200/331* (2013.01); *H03F 2200/451* (2013.01)

(58) Field of Classification Search
USPC ........ 375/219, 220, 295, 297, 316; 330/200, 330/207
See application file for complete search history.

(56) References Cited

FOREIGN PATENT DOCUMENTS

| | | |
|---|---|---|
| JP | 2009-516963 A | 4/2009 |
| JP | 2009-135615 A | 6/2009 |
| JP | 2011-41315 A | 2/2011 |
| JP | 2011-244138 A | 12/2011 |
| JP | 2013-70473 A | 4/2013 |
| WO | 2011/078120 A1 | 6/2011 |

* cited by examiner

TRANSMITTER/RECEIVER APPARATUS, TRANSMITTER APPARATUS AND TRANSMITTING/RECEIVING METHOD

CROSS REFERENCE TO RELATED APPLICATIONS

This application is a National Stage of International Application No. PCT/JP2014/005216 filed Oct. 15, 2014, claiming priority based on Japanese Patent Application No. 2013-218937, filed Oct. 22, 2013, the contents of which are incorporated herein by reference in their entirety.

TECHNICAL FIELD

The present invention relates to a transmitter/receiver apparatus, a transmitter apparatus and a transmitting/receiving method, and particularly relates to transmitter/receiver apparatuses, transmitter apparatuses and transmitting/receiving methods that can switch between a state for transmitting and a state for receiving.

BACKGROUND ART

In wireless communication apparatuses based on a Time Division Duplex (hereinafter, abbreviated as 'TDD') method, a communication time is divided by a constant time (transmitting period and receiving period), and transmitting and receiving are alternately carried out during the transmitting period and the receiving period respectively.

In the case of the TDD method, it is possible to carry out the transmitting and the receiving by use of the same carrier frequency. Accordingly, TDD has advantages that usage efficiency of frequency band is high, and it is possible to carry out asymmetric communication, and it is possible with ease to carry out the beam forming by use of information that is provided by a terminal using the same carrier frequency.

Here, the asymmetric communication means communication whose ratio of the transmitting period to the receiving period is not 1 to 1. As a specific example, there is a communication form in which a time length of uplink communication from a terminal to a base station and a time length of downlink communication from the base station to the terminal are different each other.

As a wireless communication service using the TDD method, PHS (Personal Handy-phone System), TD-CDMA (Time Division-Code Division Multiple Access), the mobile WiMAX (Worldwide Interoperability for Microwave Access), TD-LTE (Time Division-Long Term Evolution) or the like is exemplified.

In the case of the wireless communication apparatus based on the TDD method, a transmitting operation and a receiving operation are each carried out exclusively. As a result, it is possible to share an antenna and the like as a transmitter/receiver unit. As the wireless communication apparatus that shares the transmitter/receiver unit, for example, a RF transmitter/receiver device is described by PTL (Patent Literature) 1. To share the transmitter/receiver unit is carried out also by a wireless electric power transmitter apparatus (for example, refer to PTL 2) in addition to the wireless communication apparatus.

FIG. 12 shows a configuration of a typical wireless communication apparatus based on the TDD method.

A configuration and a work of a transmitter unit will be shown in the following.

A digital signal that is generated by a transmitting signal processing unit 9 is converted into an analog signal by a DA (Digital to Analog) conversion unit 91, and the analog signal is superimposed on to a RF (Radio Frequency) carrier by a modulation unit 4. The generated RF modulation signal is amplified up to a predetermined output level by a high-level output amplifier (Power Amplifier: hereinafter, abbreviated as 'PA') 10. Afterward, the amplified RF modulation signal is emitted by a shared antenna 3 through a transmit/receive switch unit 2.

A configuration and a work of a receiver unit will be shown in the following.

The RF modulation signal that is received by the shared antenna 3 passes through the transmit/receive switch unit 2 and is amplified by a low noise amplifier (hereinafter, abbreviated as 'LNA') 6.

Then, the RF modulation signal is converted into an intermediate frequency by a demodulation unit 7, and furthermore only a desired channel signal that exists in the RF modulation signal is selected. The analog signal that is generated by the selection is converted into a digital signal by an AD (Analog to Digital) conversion unit 81, and a received signal processing unit 8 carries out the digital signal processing to the digital signal to regenerate information.

In the case of the wireless communication apparatus based on the TDD method, it is possible to separately install a transmitting antennas and a receiving antenna, but in many cases, a shared antenna is used for transmitting and receiving.

In the case that the wireless communication apparatus carries out the transmitting, the transmit/receive switch unit 2 connects the shared antenna 3 and the transmitter unit and disconnects the shared antenna 3 and the receiver unit. In the case that the wireless communication apparatus carries out the receiving, the transmit/receive switch unit 2 connects the shared antenna 3 and the receiver unit and disconnects the shared antenna 3 and the transmitter unit.

An example of a specific configuration of the transmit/receive switch unit 2 is shown in FIG. 13. According to the example of the configuration, the transmit/receive switch unit 2 includes two PIN (Positive Intrinsic Negative) diodes 21 and 23, and a quarter wavelength transmission line (impedance transformer) 22. By setting a control signal Vcont to be High during the transmitting, both of the diodes 21 and 23 are set to be in a state of forward bias. At this time, a high frequency impedance of a path from an output of PA 10 to the antenna 3 becomes zero in an ideal case, and consequently a transmitted signal provided by PA 10 is emitted from the antenna 3 as a radio wave.

On the other hand, a high frequency impedance of a path from PA 10 to LNA 6 is infinite in an ideal case since one end of the quarter wavelength transmission line 22 is connected with the ground by the diode 21. Therefore, leakage of the transmitted signal from a transmitter side to a receiver side is restrained.

In contrast, during the receiving, by setting the control signal Vcont to be Low, both of the diodes 21 and 23 enter into a state of reverse bias. Therefore, a high frequency impedance seen from the antenna 3 to the receiver side becomes zero in an ideal case and a high frequency impedance seen from the transmitter side to the antenna 3 becomes infinite in an ideal case. That is, a receiving signal that is received by the antenna 3 is inputted into LNA 6, and an output terminal of PA 1 and the antenna 3 are disconnected each other.

By the way, in the case of a wireless communication apparatus that includes a plurality of the wireless communication methods or a plurality of carrier frequencies, it is necessary to switch a plurality of high frequency ports. According to the transmit/receive switch method in FIG. 13 that uses the diodes 21 and 23, and the quarter wavelength transmission line 22, a size is large and a configuration is complex, and consequently the transmit/receive switch method in FIG. 13 is unsuitable for multi-port configuration. Therefore, in the case of a wireless communication apparatus that includes a plurality of ports, a switch method that uses a semiconductor switch shown in FIG. 14 is widely used.

According to a configuration shown in FIG. 14, by setting a control signal Vcont 1 and a control signal Vcont 2 to be High and Low respectively during the transmitting, a field-effect transistor (hereinafter, abbreviated as 'FET') 25 is set to be in a conductive state, and FET 26 is set to be in a non-conductive state. Moreover, by setting the control signal Vcont 1 and the control signal Vcont 2 to be Low and High respectively during the receiving, FET 25 is set to be in the non-conductive state, and FET 26 is set to be in the conductive state. As a result, the antenna 3 and one of the transmitter side and the receiver side are connected, and the antenna 3 and the other are disconnected.

However, in the examples shown in FIG. 13 and FIG. 14, to make the diode 21 grounded is actually not perfect at a high frequency band. Moreover, a resistance at a time when FETs 25 and 26 are off is not infinite. Therefore, impedance of the transmit/receive switch unit 2 is not infinite, and consequently perfect isolation cannot be carried out. Therefore, during the transmitting, finite leakage of electric power from the transmitter unit to the receiver unit exists. The leakage from the transmitter unit to the receiver unit makes LNA saturated and makes a load changed to degrade receiving characteristics.

Moreover, also in the examples shown in FIG. 13 and FIG. 14, passage resistances of the diode 23 and FET 25 are actually not zero even when the diode 23 and FET 25 are in the conductive state. As a result, a finite electric power loss exists.

Since, in general, PA is one of blocks which consume electric power most among wireless apparatuses, an electric power loss of a PA output causes increase of electric power consumption of the whole apparatus even if the electric power loss of the PA output is minute.

A measure for solving the above-mentioned problems that are caused by the leakage from the transmitter unit to the receiver unit, and the electric power loss of PA is described, for example, in PTL 3. In the case of a digital cellular phone that is described by PTL 3, impedance that is formed by viewing a transmitter side from a transmit/receive connection point of the antenna is high during the receiving, and impedance that is formed by viewing a receiver side from the transmit/receive connection point is high during the transmitting.

Specifically, as shown in FIG. 2 of PTL 3, an electric power supply of a collector in a common emitter PA that includes a bipolar transistor is turned on, and an electric power supply of a collector in a common emitter LNA is turned off. Furthermore, a length L of a transmission line that connects an end of antenna and LNA is adjusted so that impedance that is formed by viewing the receiver side from the end of the antenna may be large. In contrast, the electric power supply of the collector in PA is turned off, and the power supply of the collector in LNA is turned on during the receiving. Furthermore, a length L' of a transmission line that connects the end of the antenna and PA is adjusted so that impedance that is formed by viewing the transmitter side from the end of the antenna may be large.

In the case of the digital cellular phone that is described by PTL 3, since electric power of PA is turned off during the receiving by the above-mentioned configuration, there is no case that the transmitter side causes disturbance for the receiver side. Moreover, in the case of the digital cellular phone that is described by PTL 3, the transmit/receive switch unit does not use any elements such as the diode and FET, the electric power loss is small and efficiency of PA is improved.

A method for solving the above-mentioned problems is described also by PTL 4. In the case of a wireless communication apparatus that is shown in FIG. 1 of PTL 4, both of a drain voltage Vd and a gate voltage Vg of a common source PA including FET are simultaneously turned off during the transmitting. By virtue of the control, an operation of PA is stopped quickly and perfectly to prevent the receiver side from being interfered by the transmitter side and to improve efficiency of the electric power.

Recently, there are some cases that a switching amplifier (D class amplifier) is used as a modulation power supply of PA based on the envelope tracking method or the like (for example, refer to PTL 5).

The switching amplifier has structure that two switching elements are arranged in a form of series-connection and connected between an electric power supply and the ground terminal. Since it is always set that one out of two switching elements is in a cut-off state, and the other is in a conductive state, a current does not flow basically between the electric power supply of the switching amplifier and the ground terminal. Therefore, the switching amplifier has an advantage that electric power consumption is small.

Here, an output signal of the switching element is a pulse signal. Then, the switching amplifier of PTL 5 includes a low-pass filter that removes a high frequency component of a pulse signal so that an output of the switching amplifier may be used as the electric power supply of PA, and outputs the filtered pulse signal as an analog signal.

CITATION LIST

Patent Literature

[PTL 1] Japanese Patent Application Laid-Open Publication No. 2011-041315 (page 20 and FIG. 12)
[PTL 2] Japanese Patent Application Laid-Open Publication No. 2013-070473 (pages 4 and 5, and FIG. 1)
[PTL 3] Japanese Patent Application Laid-Open Publication No. 1992-373317 (page 3 and FIG. 2)
[PTL 4] Japanese Patent Application Laid-Open Publication No. 2009-135615 (pages 6 and 7 and FIGS. 1 and 2)
[PTL 5] Japanese Patent Application Laid-Open Publication No. 2011-244138 (page 6 and FIG. 4)

SUMMARY OF INVENTION

Technical Problem

However, the arts that are described in PTLs 1 to 5 have the following problems.

The RF transmit/receive device that is described by PTL 1 includes an antenna switch for switching between the transmitting and the receiving. Also a wireless electric power transmitter apparatus that is described by PTL 2 includes an electric power transmitter unit switching device and an electric power receiver unit switching device for switching between transmitting and receiving.

However, in the case of the apparatuses that are described by PTLs 1 and 2, there is no measure against influence of the transmitter side on the receiver side. Therefore, there is a possibility that leakage from the transmitter unit to the receiver unit causes saturation in an amplifier of the receiver unit, and causes a load change of the receiver unit to degrade receiving characteristics. Since passage resistances of the antenna switch and the switching device are not completely zero, there is a problem that an electric power loss is caused and power consumption of the whole apparatus becomes increasing.

In the case of the wireless communication apparatuses that are described by PTL 3 and PTL 4, superficial measures against the problems caused by the leakage from the transmitter unit to the receiver unit, and the electric power loss of PA are conceived. But, degrees of improvement of electric power efficiency of PA and improvement of the electric power consumption of the whole apparatus are not sufficient. The reason is as follows.

In the case of the digital cellular phone that is described by PTL 3, by not using the transmit/receive switch unit, the loss is lowered and the electric power efficiency of PA is improved. However, in the case of the digital cellular phone that is described by PTL 3, a control transistor is arranged between a collector terminal of PA and an electric power supply in series in order to cut off supplying the collector with the electric power. Whenever PA works, the control transistor brings about an electric power loss to degrade the electric power efficiency of PA.

Also in the case of the wireless communication apparatus that is described by PTL 4, a switch unit is arranged between a drain terminal and an electric power supply in series in order to turn a drain voltage of PA on and off, and the switch unit causes the electric power loss. Accordingly, similarly to the digital cellular phone that is described by PTL 3, the wireless communication apparatus of PTL 4 lowers the electric power efficiency of PA.

Furthermore, in the case of the apparatuses that are described by PTL 3 and PTL 4, there is a problem that the number of components of each apparatus becomes large and control becomes complex due to the measures against the problems caused by the leakage from the transmitter unit to the receiver unit, and the electric power loss of PA. The reason is as follows.

In the case of the digital cellular phone that is described by PTL 3, in order to turn the collector voltages of PA and LNA on and off, a control transistor and a control signal for controlling the control transistor are required.

Moreover, in the case of the wireless communication apparatus that is described by PTL 2, a switch unit for turning a drain voltage and a gate voltage on and off, and a control signal for controlling the switch unit are required.

Further, the apparatuses that are described by PTL 3 and PTL 4 have a problem that it is difficult to carry out quick switching between the transmitting and the receiving. The reason is as follows.

In the case of the digital cellular phone that is described by PTL 3, by turning the collector voltages of PA and LNA on and off, switching between the transmitting and the receiving is carried out.

In the case of the wireless communication apparatus that is described by PTL 4, by controlling both of the drain voltage and the gate voltage, it is intended to carry out speedier and secure on/off control for PA. With regard to the necessity of changing the FET's terminal voltage in a short period of time and achieving stable operation, the control in the wireless communication apparatus described in PTL 4 is similar to a control of only drain voltage such as performed in the digital cellular phone described in PTL 3.

However, it is generally difficult to turn voltages of a collector terminal and a drain terminal, through which large currents flow respectively, on and off at a high speed. In the case of the apparatuses that are described by PTLs 3 and 4, the current mode PA of the common emitter or the common source is used. An operation principle of the current mode PA is to extract a RF (Radio Frequency) signal from a DC (Direct Current) current that constantly flows through a collector or a drain. Therefore, it is necessary to turn a constant DC current on and off in order to perfectly turn PA on and off, but it is usually difficult to turn such the large DC current on and on at a high speed.

Therefore, in the case of the apparatuses that are described by PTLs 3 and 4, it is difficult to carry out high-speed switching between the transmitting and the receiving, and consequently the apparatuses that are described by PTLs 3 and 4 are not suitable for a system such as TDD that switches between a transmitting operation and a receiving operation at a short time interval.

The switching amplifier that is described by PTL 5 is used for supplying electric power to PA that uses the envelope tracking method or the like. Therefore, a measure for restraining influence of the transmitter side on the receiver side is not considered in particular in PTL 5.

Object of the Present Invention

An object of the present invention is to provide a transmitter/receiver apparatus, a transmitter apparatus and a transmit/receive method, that can cope with reducing the leakage of the electric power from the transmitter unit to the receiver unit, improving the power efficiency and quickly switching between the transmitting and the receiving, in a communication apparatus that carries out switching between a state for transmitting and a state for receiving.

Solution to Problem

A transmitter/receiver apparatus of the present invention is characterized in that: the transmitter/receiver apparatus includes: a transmit/receive terminal that is shared between transmitting of a transmitted signal and receiving of a received signal; a switching amplifier that includes a low-side switching element connected between a ground terminal and a pulse output terminal, a high-side switching element connected between the pulse output terminal and an electric power supply terminal and a filter for passing a predetermined frequency component of a pulse signal and outputting the filtered pulse signal from a transmitter terminal as the transmitted signal, and that outputs the pulse signal from the pulse output terminal; and a transmit/receive switch unit that switches a connection status between the transmit/receive terminal and the transmitter terminal and also switches a connection status between the transmitting/receiving terminal and a receiver terminal inputting the received signal; and during the receiving, on the basis of the connection status between the transmit/receive terminal and the transmitter terminal, the low-side switching element and the high-side switching element are fixed to a conductive state and a non-conductive state respectively, to the non-conductive state and the conductive state respectively, or to the non-conductive state and the non-conductive state respectively.

A transmitter apparatus of the present invention is characterized in that: the transmitter apparatus includes a switching amplifier that includes a low-side switching element connected between a ground terminal and a pulse output terminal and a high-side switching element connected between the pulse output terminal and an electric power supply terminal, and that outputs a pulse signal from the pulse output terminal; and in a transmit/receive device that transmits a transmitted signal generated from the pulse signal, and receives a received signal provided from the outside, during the receiving, at least one of the low-side switching element and the high-side switching element is fixed to a cut-off state.

A transmitting/receiving method of the present invention is characterized in that: the transmitting/receiving method, that is used in a transmitter/receiver apparatus including: a transmitter/receiver terminal that is shared between transmitting of a transmitted signal and receiving of a received signal; a switching amplifier that includes a low-side switching element connected between a ground terminal and a pulse output terminal and a high-side switching element connected between the pulse output terminal and an electric power supply terminal and that outputs a pulse signal from the pulse output terminal; a filter that passes a predetermined frequency component of the pulse signal and outputs the filtered pulse signal as the transmitted signal from a transmitter terminal; and a transmit/receive switch unit that switches a connection status between the transmitter/receiver terminal and the transmitter terminal and also switches a connection status between the transmitter/receiver terminal and a receiver terminal inputting the received signal, comprises: fixing the low-side switching element and the high-side switching element to a conductive state and a non-conductive state respectively, to the non-conductive state and the conductive state respectively or to the non-conductive state and the non-conductive state respectively on the basis of the connection status between the transmitter/receiver terminal and the transmitter terminal during the receiving.

Advantageous Effect of Invention

In the transmitter/receiver apparatus, the transmitter apparatus and the transmitting/receiving method, a switching amplifier is used as PA for transmitter.

During receiving, at least one out of two switching elements that are connected in series and connected between an electric power supply and a ground terminal is fixed to a cut-off state, and consequently a current does not flow through the switching element. Therefore, current consumption of PA automatically becomes zero, and also an output signal is not generated.

Accordingly, leakage of electric power from a transmitter unit to a receiver unit is quite small.

The electric power loss, that is caused by using the switch for turning the drain or the collector on and off like the apparatuses of PTLs 3 and 4, is not caused.

Furthermore, since there is no output from the switching amplifier during the receiving, a configuration of a transmit/receive switch unit is extremely simplified, and an electric power loss of the transmit/receive switch unit disappears. Therefore, it is possible to keep the electric power efficiency of PA high, and also to reduce the electric power consumption of the apparatus.

Moreover, in the transmitter/receiver apparatus, the transmitter apparatus and the transmitting/receiving method, an input signal serves as a control signal for switching between an operation state and a non-operation state of an amplifier.

Therefore, it is not necessary to use the switch unit for turning the drain and the collector on and off, and the control unit for controlling the switch unit that are used in the apparatuses of PTL 3 and 4.

Furthermore, since there is no output of the switching amplifier during the receiving, it is possible to simplify a configuration of the transmit/receive switch unit, and consequently to reduce the number of components and to miniaturize the apparatus.

Moreover, since the constant DC current does not exist in the switching amplifier of the present invention, it is possible to make a switching frequency as high as a RF carrier frequency. Therefore, it is possible to realize the quite quick on/off operation of the switching element and also to carry out the speedy switching between the transmitter and the receiver.

DESCRIPTION OF EMBODIMENTS

An exemplary embodiment of the present invention will be explained in detail in the following with reference to drawings.

First Exemplary Embodiment

[Configuration of First Exemplary Embodiment]

Figure 1:
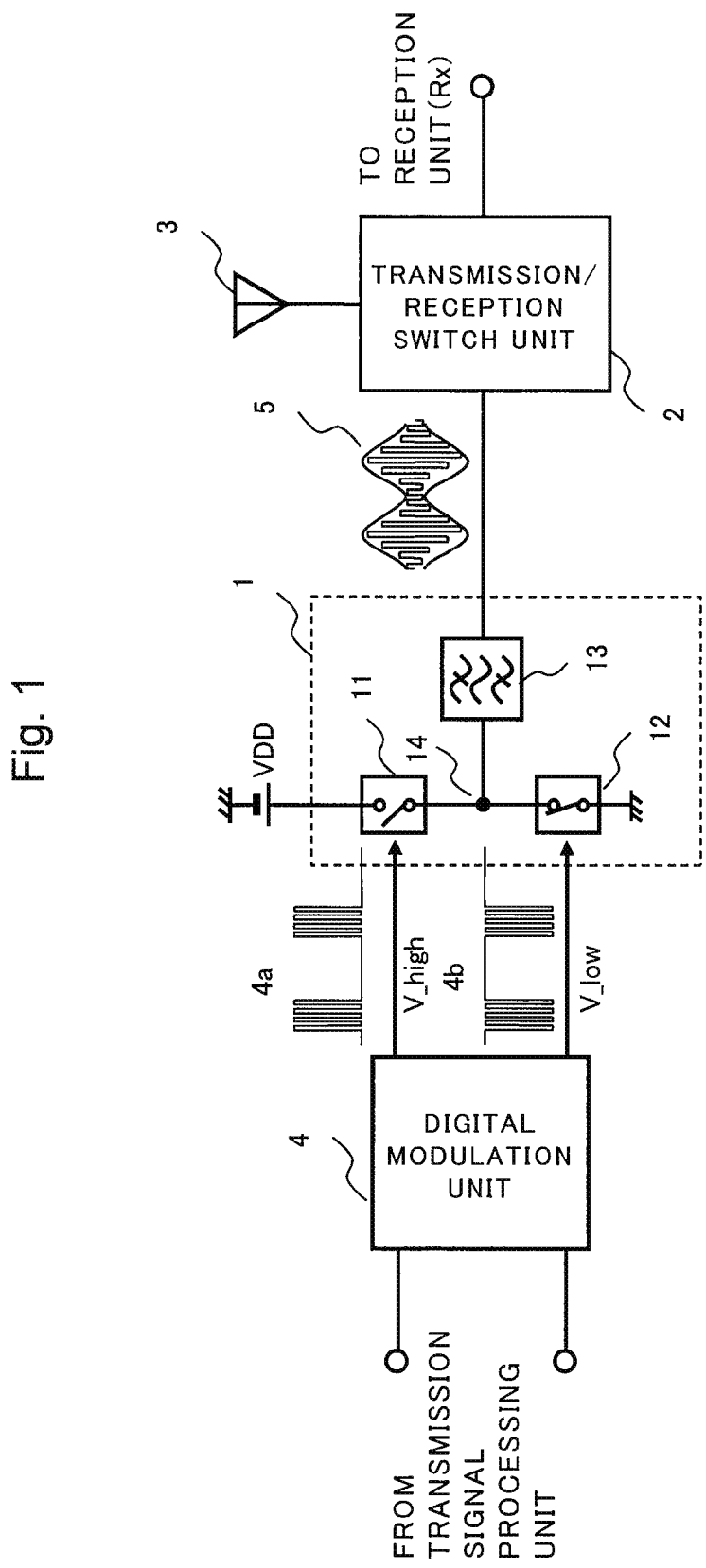
FIG. 1 is a block diagram showing a configuration of a wireless communication apparatus of a first exemplary embodiment of the present invention.

FIG. 1 is a block diagram showing a configuration of a wireless communication apparatus that is a first exemplary embodiment of the present invention.

The wireless communication apparatus of the present exemplary embodiment includes a switching amplification unit 1, a transmit/receive switch unit 2, an antenna 3 and a digital modulation unit 4.

The switching amplification unit 1 includes two switching elements 11 and 12 that are arranged in a form of series-connection and connected between an electric power supply and the ground, and a filter 13.

The digital modulation unit 4 receives input of data provided by a transmitting signal processing unit (not shown in the drawing), and outputs switching amplifier control signals 4a and 4b that are complementary two-level pulse signals including information of the inputted data as time information. The switching amplifier control signals 4a and 4b are inputted into the switching amplification unit 1 to set the switching elements 11 and 12 to be in a conductive state and a non-conductive state respectively, or in the non-conductive state and the conductive state respectively. Accordingly, a pulse output terminal 14, which is arranged at a connection point of the switching element 11 and the switching element 12, outputs a pulse signal in which the amplitudes of the switching amplifier control signals 4a and 4b are amplified up to an electric power supply voltage VDD. The pulse signal is changed to an output signal 5 that is a RF carrier on which information of the original data is superimposed.

The filter 13 is connected with the pulse output terminal 14. The filter 13 removes harmonic components and a quantization noise component of the pulse signal that is amplified by the switching amplification unit 1. Then, the filter 13 passes a frequency component in a predetermined band and outputs the frequency component as the transmitted signal 5.

That is, the filter 13 is a band-pass filter.

The transmit/receive switch unit 2 is connected between an output of the filter 13 and a receiver unit (not shown in the drawing). Furthermore, the transmit/receive switch unit 2 is connected also with the antenna 3 to switch between a path from the antenna 3 to a transmitter unit and a path from the antenna 3 to the receiver unit.

Figure 2:
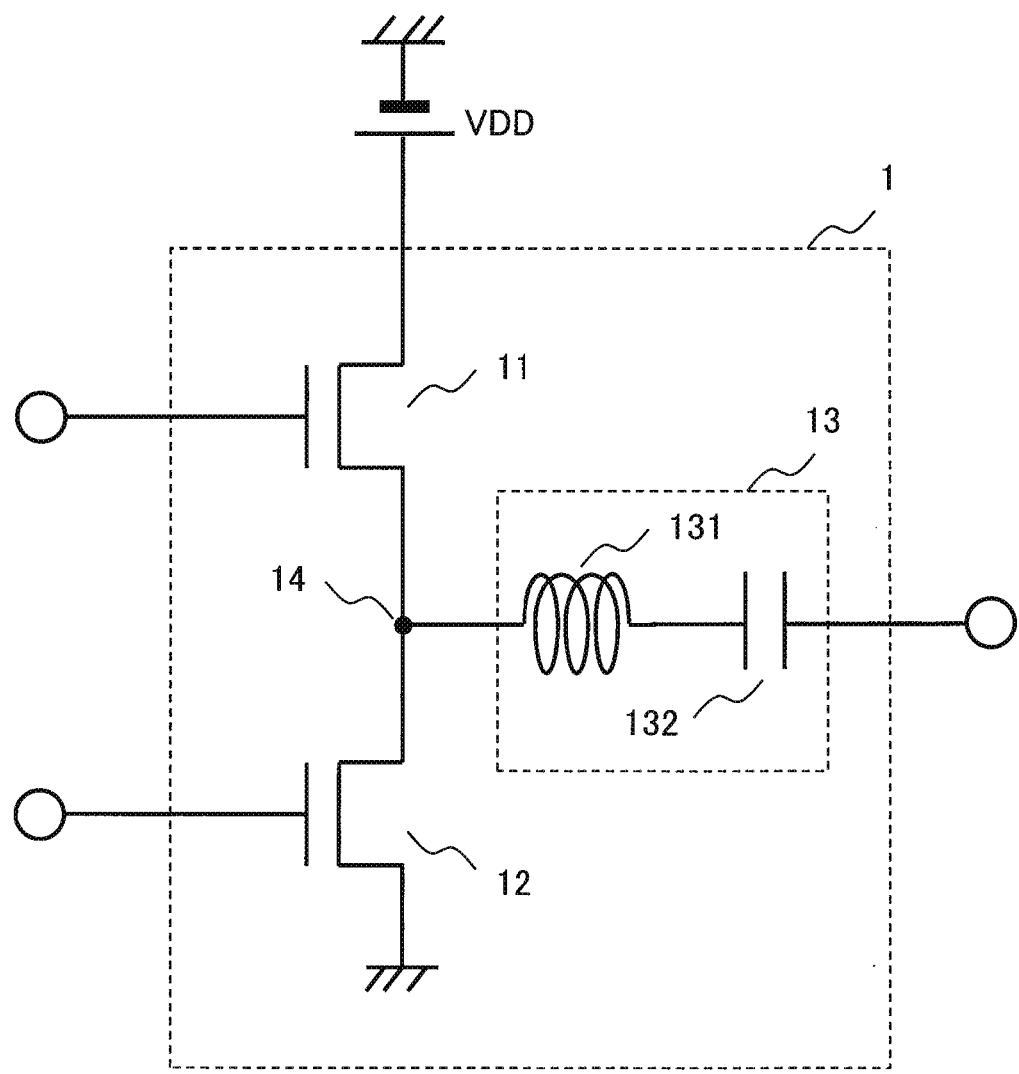
FIG. 2 is a block diagram showing a specific configuration of a switching amplification unit of the wireless communication apparatus of the first exemplary embodiment of the present invention.

FIG. 2 shows an example of a more specific configuration of the switching amplification unit 1. In the example, as the switching elements 11 and 12, field effect transistors (FET) are used. As the filter 13, a second-order filter including an inductor 131 and a capacitor 132 that are connected in series is used. The switching elements 11 and 12 work complementarily each other, and amplifies the inputted pulse signal to generate a pulse signal whose amplitude is corresponding to the electric power supply voltage VDD, and each output the generated pulse signal through the filter 13.

Figure 3:
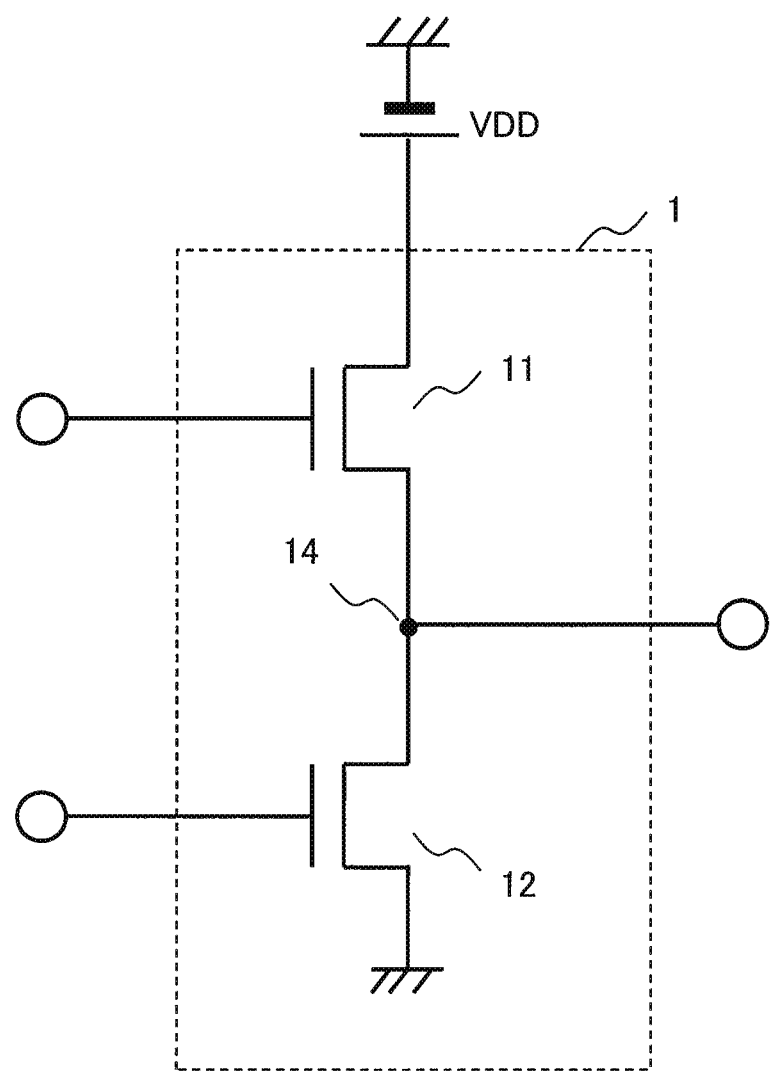
FIG. 3 is a block diagram showing the minimum configuration of the switching amplification unit of the wireless communication apparatus of the first exemplary embodiment of the present invention.

Here, as shown in FIG. 3, the switching amplification unit 1 may include only the switching elements 11 and 12, and the filter 13 may be arranged outside the switching amplification unit 1 to be connected with an output terminal of the switching amplification unit 1.

Moreover, the switching elements 11 and 12 are not limited to FETs, and bipolar transistors may be used as the switching elements 11 and 12. In the example shown in FIG. 2, n type FETs are used as the switching elements 11 and 12, and receive input of complementary signals provided by the digital modulation unit 4. Instead of using the n type FET, transistors having different polarities such as a n-type metal oxide semiconductor (MOS) and a p-type MOS may be arranged in a form of series-connection and may receive input of the same polarity signal respectively from the digital modulation unit 4. Moreover, a configuration of the filter 13 is not limited to the configuration shown in FIG. 2, and it is possible to appropriately change order and the configuration of the filter.

Figure 4:
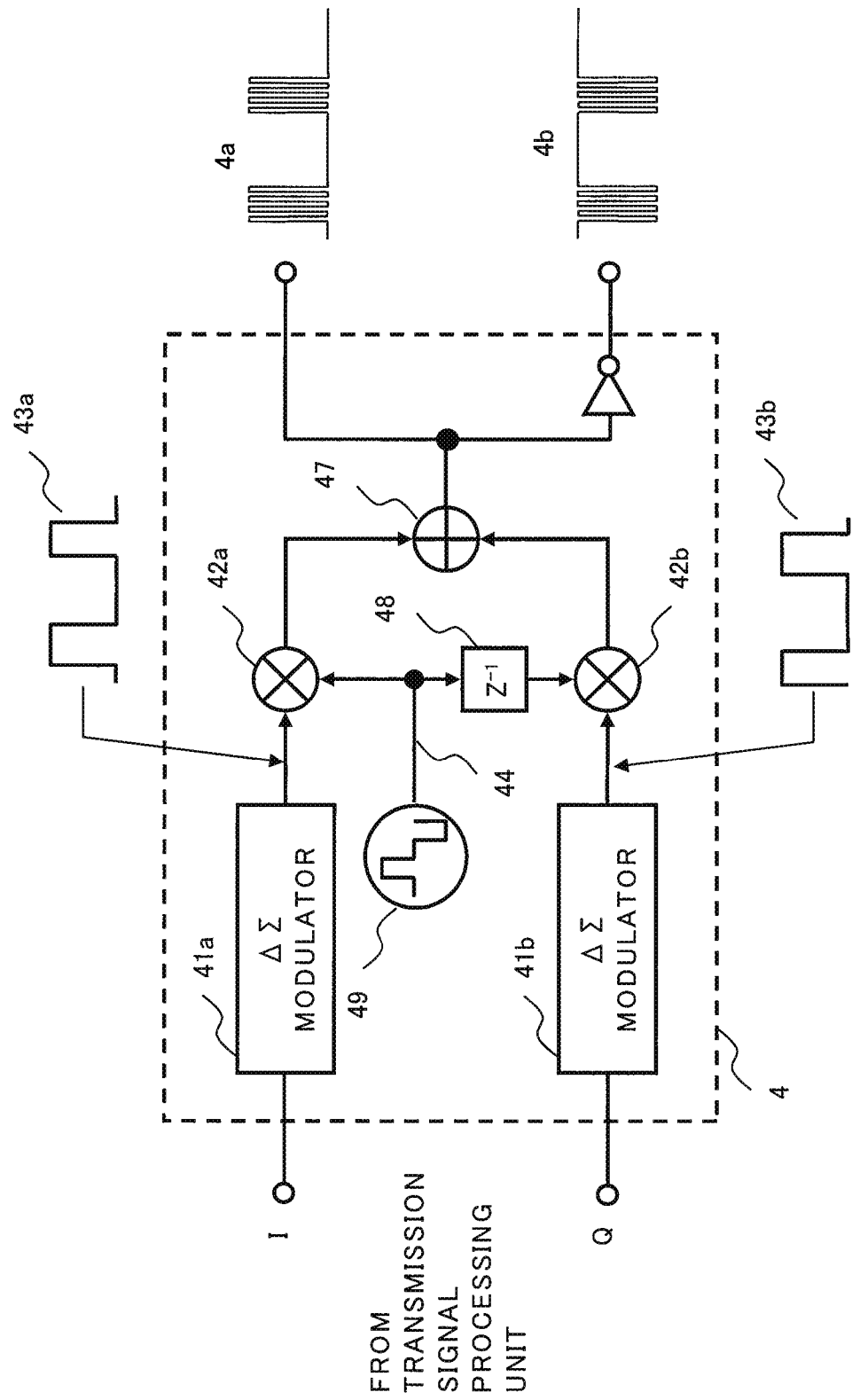
FIG. 4 is a block diagram showing a specific configuration of a digital modulation unit of the wireless communication apparatus of the first exemplary embodiment of the present invention.

FIG. 4 shows an example of a more specific configuration of the digital modulation unit 4.

In the digital modulation unit 4, delta-sigma modulators 41a and 41b receive input of an I (In) signal and a Q (quadrature) signal respectively that are provided by a transmitting signal processing unit and are orthogonal to each other, and convert the I signal and the Q signal into one bit signals 43a and 43b respectively. The acquired one bit signals 43a and 43b are multiplied by a clock 44, which a clock generator 49 generates and whose clock frequency fclk is 4 times as high as a carrier frequency fc, by mixers 42a and 42b respectively. Here, the clock 44 has three levels of value '1', '0' and '−1', and the level of the clock 44 changes in the order of '1', '0', '−1' and '0' at the clock frequency fclk. That is, the level of the clock 44 has a repeated pattern {'1', '0', '−1' and '0'} which forms one cycle and whose repetition frequency is the same as the carrier frequency fc.

At this time, a delay unit 48 makes the clock 44 delayed by one clock of the clock frequency fclk and afterward the clocks are inputted to the mixers 42a and 42b where multiplied with the one bit signals 43a and 43b respectively. As a result, an orthogonal relation between the I signal and the Q signal is maintained. Furthermore, the multiplied two signals are added by an adder 47. As a result, a switching amplifier control signal 4a, that is a pulse signal stream in which the I signal and the Q signal are added on to the clock 44 in the order of {I, Q, −I, −Q}, is acquired. The switching amplifier control signal 4a and a switching amplifier control signal 4b that is a complementary signal of the switching amplifier control signal 4a become input signals to the switching amplifier 1 respectively.

Figure 5:
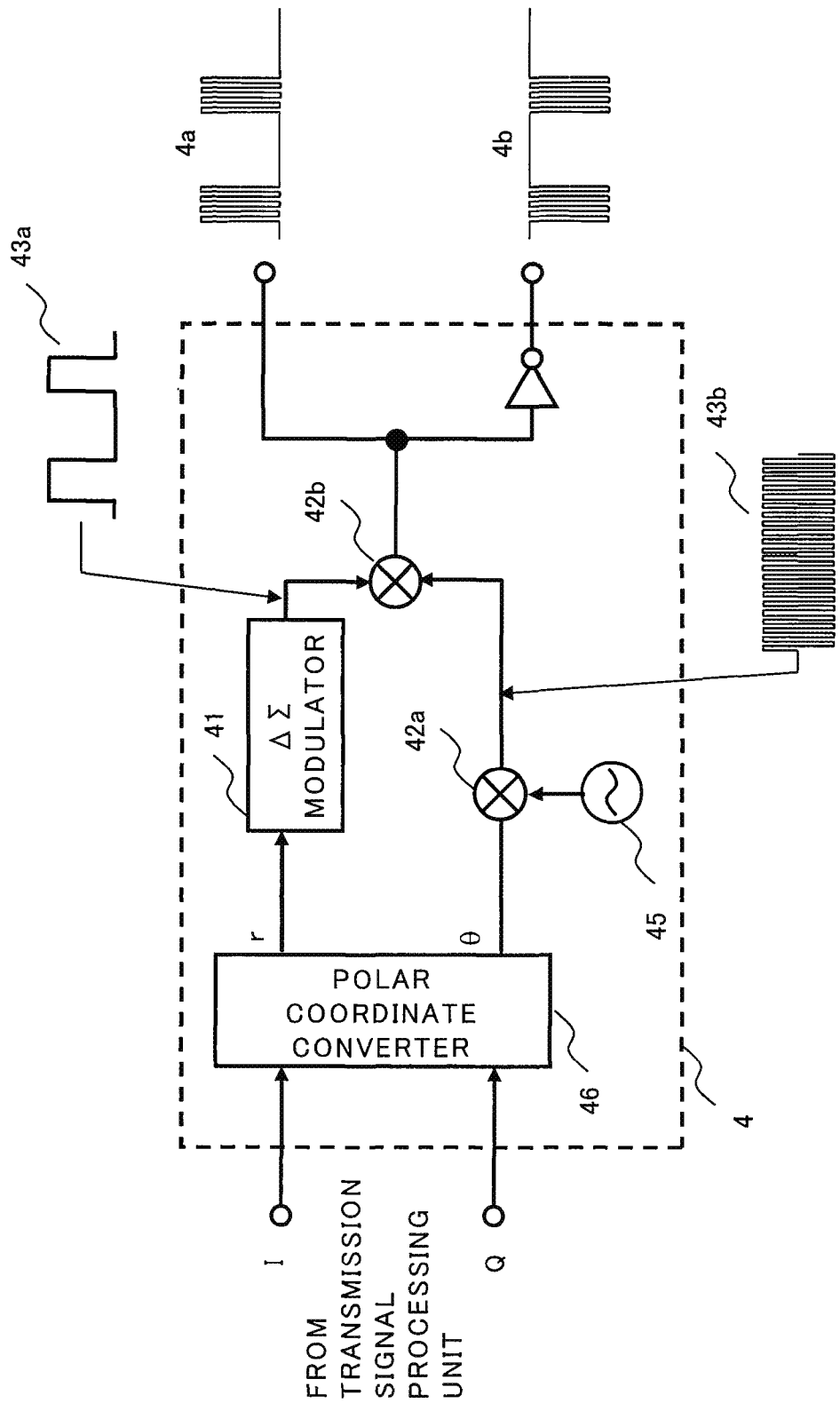
FIG. 5 is a block diagram showing another specific configuration of the digital modulation unit of the wireless communication apparatus of the first exemplary embodiment of the present invention.

FIG. 5 shows another example of the more specific configuration of the digital modulation unit 4.

By use of a polar coordinate converter 46, the digital modulation unit 4 converts the I signal and the Q signal, that are orthogonal each other and are provided by the transmitting signal processing unit (not shown in the drawing), into an amplitude component r and a phase component θ. The amplitude component r is converted into the one bit signal 43a by a delta-sigma modulator 41. The phase component θ is multiplied by a RF carrier, that is provided by an oscillator 45, by the mixer 42a, and the mixer 42a outputs a phase modulation signal 43b.

The one bit signal 43a converted from the amplitude component and the phase modulation signal 43b are multiplied by the mixer 42b. As a result, the phase modulation signal 43b is on-off controlled with one bit signal 43a, which is an output pulse modulation signal of the delta-sigma modulator 41, and becomes the switching amplifier control signal 4a that is a pulse modulation signal. Then, the switching amplifier control signal 4a and the switching amplifier control signal 4b that is a complementary signal of the switching amplifier control signal 4a are corresponding to input signals of the switching amplifier 1 respectively.

Figure 13:
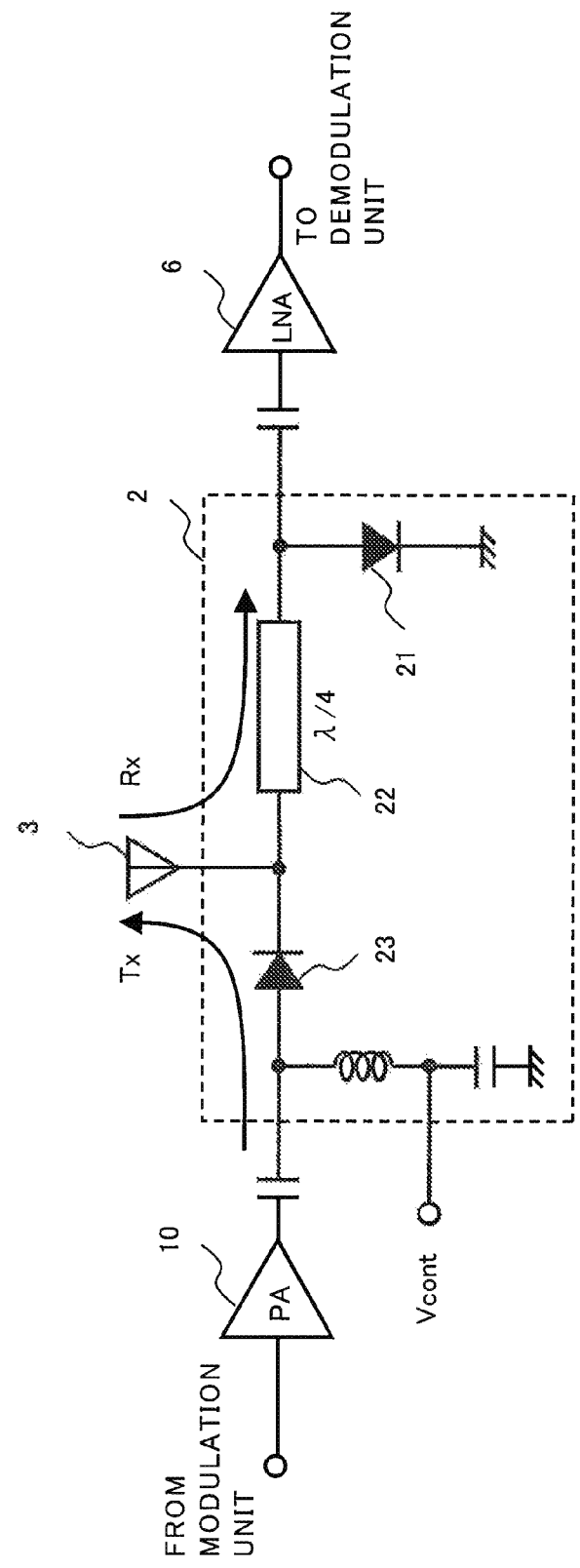
FIG. 13 is a block diagram showing an example of a specific configuration of a transmit/receiving switch unit of a wireless communication apparatus.
Figure 14:
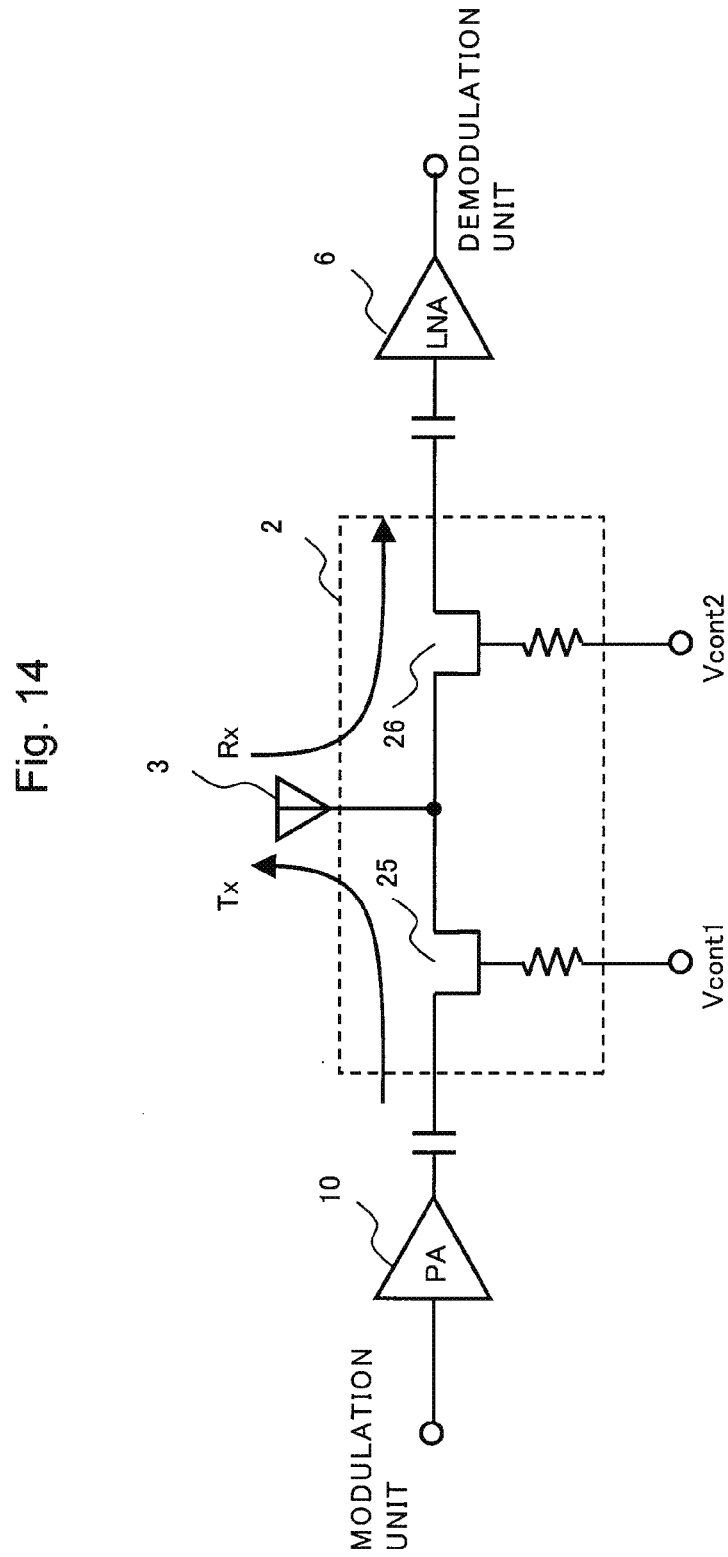
FIG. 14 is a block diagram showing an example of a specific configuration of another transmit/receive switch unit of the wireless communication apparatus.

Since it is possible to apply the configurations shown in FIG. 13 and FIG. 14 to a configuration of the transmit/receive switch unit 2 as it is, description of the configuration of the transmit/receive switch unit 2 is omitted.

[Effect of First Exemplary Embodiment]

Figure 6:
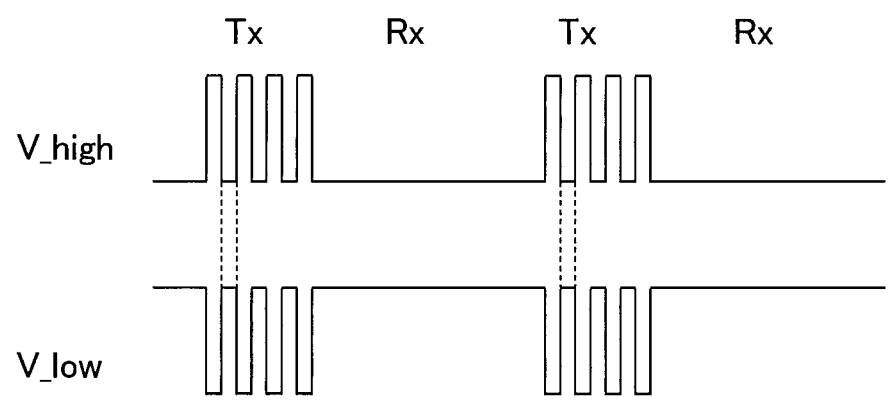
FIG. 6 is a timing chart showing a waveform of a switching amplifier control signal of the wireless communication apparatus of the first exemplary embodiment of the present invention.

FIG. 6 shows an example of the switching amplifier control signal in the present exemplary embodiment.

At a transmitting period (hereinafter, also referred to as 'Tx period'), the digital modulator 4 outputs the complementary two-level pulse signals, that is, the switching amplifier control signal 4a (V_high) for high-side switching element, and the switching amplifier control signal 4b (V_low) for low-side switching element. At a receiving period (hereinafter, also referred to as 'Rx period'), V_high is fixed to 'Low' state, and V_low is fixed to 'High' state. In this case, the switching element (high-side FET) 11 of the switching amplification unit 1 shown in FIG. 2 is set to be in the non-conductive state, and the switching element (low-side FET) 12 is set to be in the conductive state, and consequently the pulse output terminal 14 of the switching amplification unit 1 is grounded, and RF output electric power disappears. That is, leakage of electric power from a transmitter side to a receiver side is not caused. Moreover, at the receiving (Rx) period, a standby current of the transmitter side switching amplifier becomes zero and electric power consumption is reduced.

According to the present exemplary embodiment, without using an additional switch component for turning the collector voltage and the drain voltage on and off like the apparatuses of PTL 3 and 4, it is possible to realize reduction of the leakage of the electric power to the receiver side, and the cut-off of the standby current of PA during only the receiving by use of the switching amplifier control signals 4a and 4b. Accordingly, the present exemplary embodiment enables to downsize and reduce cost of the wireless communication apparatus. Furthermore, according to the present exemplary embodiment, it is possible to switch between the transmitting and the receiving at substantially the same speed as ones of the switching amplifier control signals 4a and 4b.

Here, in the example shown in FIG. 6, at the receiving (Rx) period, the switching amplifier control signal 4a (V_high) is fixed to the 'Low' state, and the switching amplifier control signal 4b (V_low) is fixed to the 'High' state. In contrast, the switching amplifier control signal 4a (V_high) may be fixed to the 'High' state, and the switching amplifier control signal 4b (V_low) may be fixed to the 'Low' state at the receiving (Rx) period. In this case, from a DC point of view, VDD appears at the pulse output terminal 14 of the switching amplifier 1 as a voltage, but a DC current does not flow since the low-side FET 12 is set to be in the non-conductive state. Moreover, since, from a RF point of view, a phenomenon that a voltage of the pulse output terminal 14 becomes VDD has the same effect as a short-circuited state has, this case has the same effect as the case shown in FIG. 6 has.

Alternatively, at the receiving (Rx) period, both of V_high and V_low may be fixed to the 'Low' state. In this case, both of the high-side FET 11 and the low-side FET 12 of the switching amplifier 1 are set to be in the non-conductive state, and the RF output electric power disappears. That is, during the receiving, the leakage of the electric power from the transmitter side to the receiver side is not caused. Moreover, at the receiving (Rx) period, the waiting current of the transmitter side switching amplifier becomes zero and electric power consumption is reduced.

Furthermore, as a result of both of the high-side FET 11 and the low-side FET 12 entering into the non-conductive state at the receiving (Rx) period, impedance seen from an end of the antenna to the transmitter side becomes high impedance. Therefore, by making the impedance seen from the end of the antenna to the transmitter side match with transmitter side impedance of the transmit/receive switch unit 2 at the receiving (Rx) period, an effect that a degree of isolation between the transmitter unit and the receiver unit becomes quite improved is acquired. That is, the leakage of the electric power from the transmitter unit to the receiver unit is quite small.

Here, the example shown in FIG. 1 is an example of transmitter/receiver control carried out in a wireless communication apparatus based on the TDD method that includes one transmitter system and one receiver system. The transmitter/receiver control of the present exemplary embodiment is also applicable to a wireless communication apparatus or the like that uses a plurality of wireless communication methods or a plurality of RF carrier frequencies.

Second Exemplary Embodiment

[Configuration of Second Exemplary Embodiment]

Figure 7:
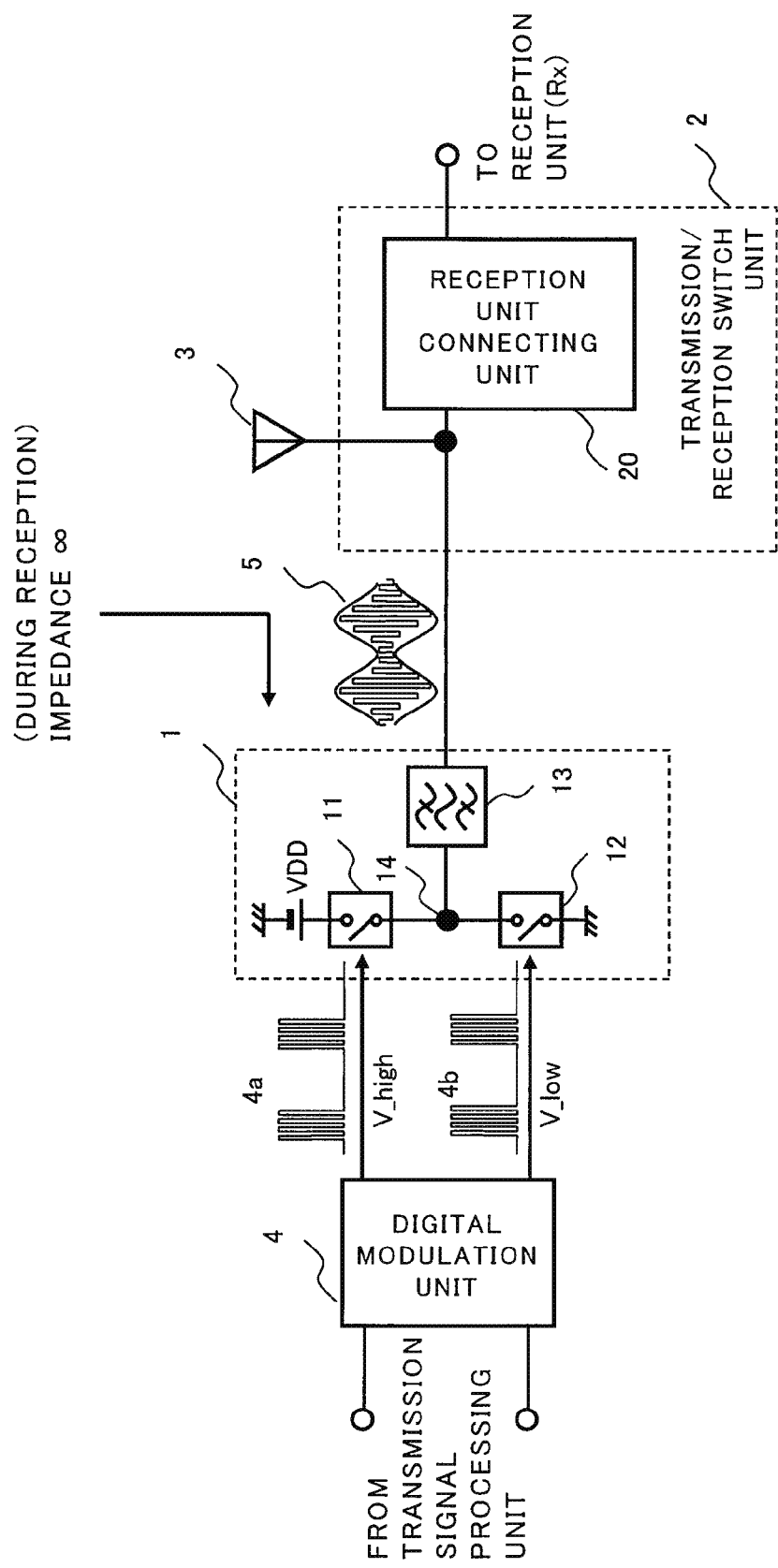
FIG. 7 is a block diagram showing a configuration of a wireless communication apparatus of a second exemplary embodiment of the present invention.

FIG. 7 is a block diagram showing a configuration of a wireless communication apparatus of a second exemplary embodiment of the present invention. In the case of the wireless communication apparatus of the present exemplary embodiment, the switching amplification unit 1 is directly connected with the antenna 3.

Similarly to the wireless communication apparatus of the first exemplary embodiment, the wireless communication apparatus of the present exemplary embodiment includes the switching amplification unit 1, the transmit/receive switch unit 2, the antenna 3 and the digital modulation unit 4.

The switching amplification unit 1 includes the two switching elements 11 and 12 that are arranged in a form of series-connection and connected between an electric power supply and the ground and includes the filter 13.

The digital modulation unit 4 receives input of data provided by a transmitting signal processing unit (not shown in the drawing), and outputs the switching amplifier control signals 4a and 4b that are complementary two-level pulse signals including information of the inputted data as time information. The switching amplifier control signals 4a and 4b are inputted into the switching amplification unit 1 and set the switching elements 11 and 12 to be in the conductive state and the non-conductive state respectively, or in the non-conductive state and the conductive state respectively. Accordingly, the pulse output terminal 14 that serves as the connection point of the switching element 11 and the switching element 12 outputs the pulse signal in which the amplitudes of the switching amplifier control signals 4a and 4b are amplified up to an electric power supply voltage VDD. The pulse signal is changed to the output signal 5 that is a RF carrier on which information of the original data is superimposed.

The filter 13 is connected with the pulse output terminal 14. The filter 13 removes harmonic components and a quantization noise component of the pulse signal that is amplified by the switching amplification unit 1. Then, the filter 13 passes a frequency component in a predetermined band, and outputs the frequency component as the transmitted signal 5.

That is, the filter 13 is a band-pass filter. Differently from the first exemplary embodiment, the output of the filter 13 is directly connected with the antenna 3.

The transmit/receive switch unit 2 directly connects the output point of the filter 13 and the antenna 3. Moreover, the transmit/receive switch unit 2 includes a receiver unit connecting unit 20. The receiver unit connecting unit 20 is connected between the antenna 3 and a receiver unit (not shown in the drawing) and switches between a connected state and a disconnected state between the antenna 3 and the receiver unit.

An example of a more specific configuration of the switching amplification unit 1 is the same as the configuration shown in FIG. 2, and then explanation on the example is omitted here. Moreover, an example of a more specific configuration of the digital demodulation unit 4 is the same as the configurations shown in FIG. 4 and FIG. 5, and then explanation on the example is omitted here.

[Effect of Second Exemplary Embodiment]

Figure 8:
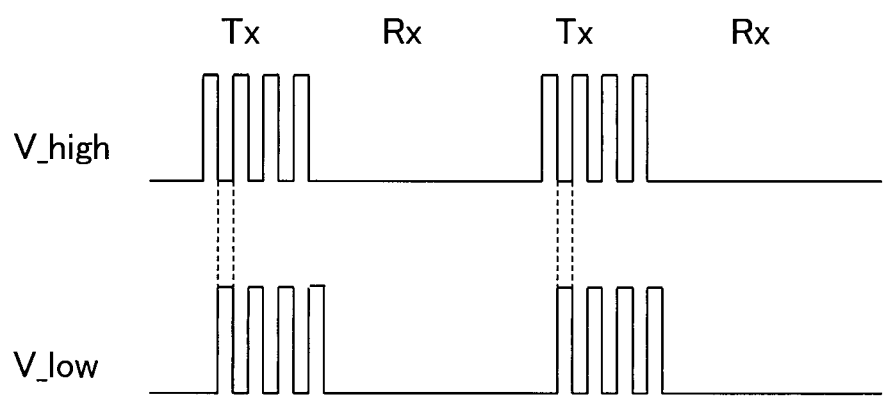
FIG. 8 is a timing chart showing a waveform of a switching amplifier control signal of the wireless communication apparatus of the second exemplary embodiment of the present invention.

FIG. 8 shows an example of the switching amplifier control signal in the present exemplary embodiment.

At the transmitting (Tx) period, the digital modulation unit 4 outputs the complementary two-level pulse signals, that is, the switching amplifier control signal 4*a* (V_high) and the switching amplifier control signal 4*b* (V_low). At the receiving (Rx) period, both of V_high and V_low are fixed to the 'Low' state. In this case, the switching element (high-side FET) 11 and the switching element (low-side FET) 12 of the switching amplification unit 1 shown in FIG. 2 are set to be in the non-conductive state, and consequently the RF output electric power disappears. That is, during the receiving, the leakage of the electric power from the transmitter side to the receiver side is not caused. Moreover, at the receiving (Rx) period, the waiting current of the transmitter side switching amplifier becomes zero and electric power consumption is reduced.

Furthermore, according to the present exemplary embodiment, as a result of the high-side FET (switching element 11) and the low-side FET (switching element 12) entering into the non-conductive state at the receiving (Rx) period, impedance seen from the end of the antenna to the transmitter side becomes high. Therefore, it is possible to delete the switch that is used for disconnecting the antenna 3 and the switching amplification unit 1. As a result, there is no component to cause a loss through a path from the switching amplification unit 1, that is corresponding to PA causing the largest influence of the electric power loss in the usual wireless communication apparatus, until the antenna 3, and consequently efficiency in the electric power consumption of the whole wireless communication apparatus is improved.

According to the present exemplary embodiment, without using an additional switch component that is used for turning the collector voltage and the drain voltage on and off like the apparatuses of PTL 3 and 4, it is possible to realize reduction of the leakage of the electric power to the receiver side, and cut-off of the waiting current of PA during the receiving only by use of the switching amplifier control signals 4*a* and 4*b*. By virtue of the above, according to the present exemplary embodiment, it is possible to miniaturize the wireless communication apparatus and to lower a cost of the wireless communication apparatus. Furthermore, according to the present exemplary embodiment, it is possible to switch between the transmitter and the receiver at the same speed as ones of the switching amplifier control signals 4*a* and 4*b*.

Figure 9:
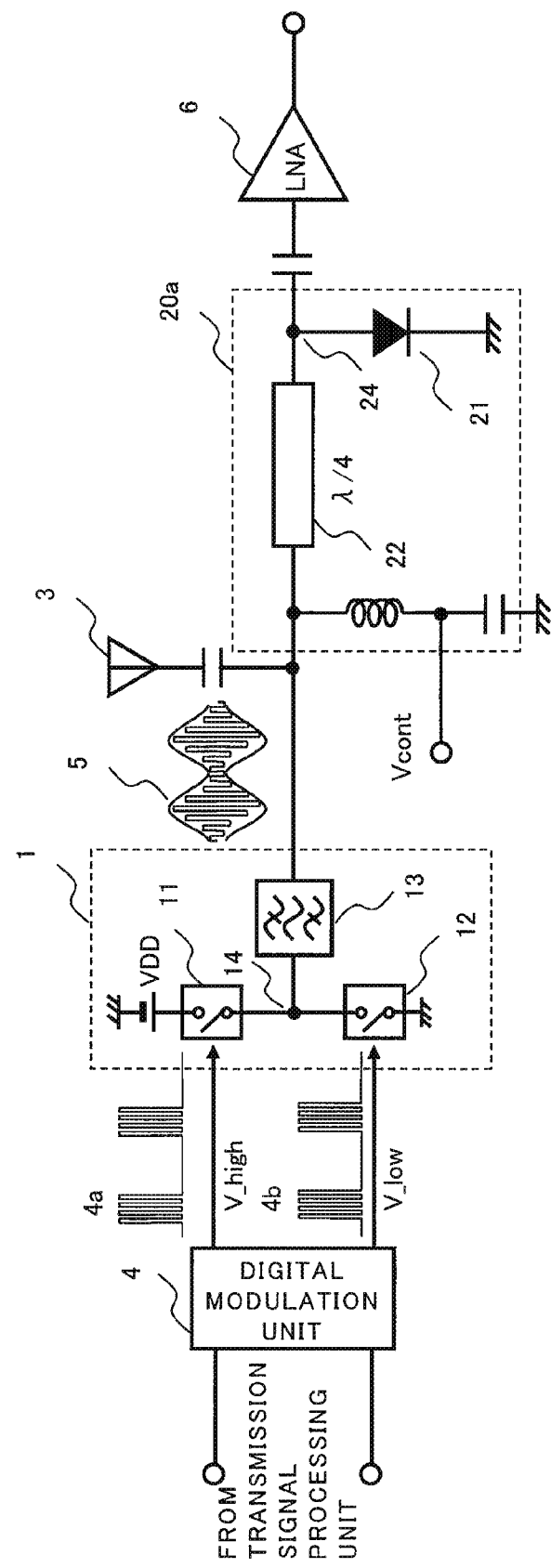
FIG. 9 is a block diagram showing a specific configuration of a transmit/receive switch unit of the wireless communication apparatus of the second exemplary embodiment of the present invention.

FIG. 9 shows an example of a specific configuration of the receiver unit connecting unit 20, that is referred to as a receiver unit connecting unit 20*a*, in the transmit/receive switch unit 2 of the present exemplary embodiment.

The receiver unit connecting unit 20*a* shown in FIG. 9 includes a diode 21 and a quarter wavelength transmission line 22.

When the wireless communication apparatus carries out the transmitting (Tx period in FIG. 8), a control signal Vcont is set to 'High' At this time, a bias in a forward direction is applied to the diode 21, and an anode terminal 24 of the diode 21 is grounded from a RF point of view. Moreover, by the impedance conversion effect of the quarter wavelength transmission line 22, impedance of the receiver unit connecting unit 20*a* from the antenna 3 to the receiver side becomes infinite in an ideal case. Therefore, the transmitted signal 5 provided by the switching amplification unit 1 is emitted from the antenna 3 with no leakage to the receiver side. At this time, since there is no component to cause a loss between the switching amplification unit 1 and the antenna 3 as mentioned above, it is possible to carry out the transmitting with the high efficiency in the electric power usage.

When the wireless communication apparatus carries out the receiving (Rx period in FIG. 8), the control signal Vcont is set to 'Low'. At this time, a bias in a reverse direction is applied to the diode 21, and consequently the diode 21 enters into an open state. Meanwhile, the characteristic impedance of the quarter wavelength transmission line 22 is designed so as to match with an input impedance (for example, 50Ω) of LNA. Accordingly, impedance of the receiver unit connecting unit 20*a* that is formed by viewing the receiver side from the antenna 3 becomes zero, and the antenna 3 is equivalently short-circuited to an input of LNA.

Furthermore, by setting V_high and V_low in such a way that the switching elements 11 and 12 enter into the open state at the receiving (Rx) period as shown in FIG. 8, it is possible to keep the impedance, that is seen from the end of the antenna to the transmitter side, high. Accordingly, it is possible to separate the received signal without providing the transmit/receive switch unit between the antenna 3 and the switching amplification unit 1 for the transmitting. In this case, it is possible to vastly reduce the number of components and the cost in comparison with the apparatuses of PTLs 3 and 4.

Furthermore, since the switching amplification unit 1 does not output any output signal at the receiving (Rx) period, the leakage of the electric power from the transmitter side to the receiver side does not exist in principle. Accordingly, in the case of the wireless communication apparatus of the present invention, it is possible to improve also the receiving characteristics in comparison with the apparatuses of PTLs 3 and 4.

Figure 10:
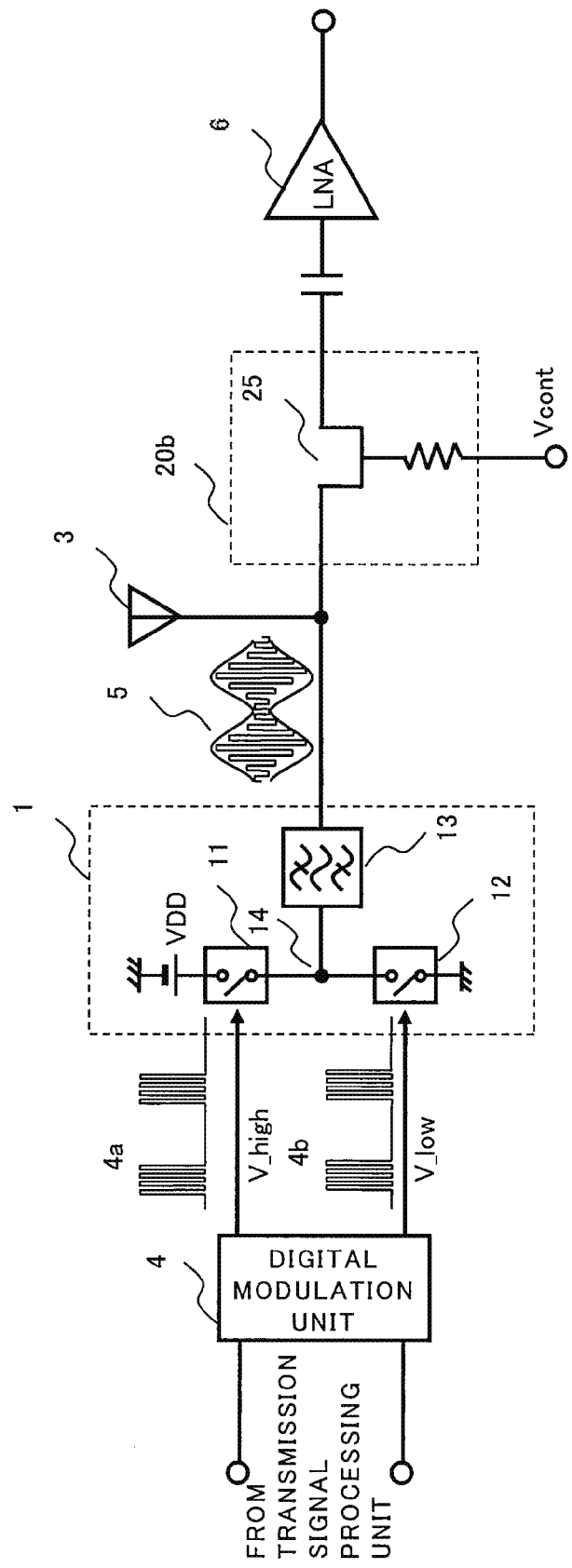
FIG. 10 is a block diagram showing another specific configuration of the transmit/receive switch unit of the wireless communication apparatus of the second exemplary embodiment of the present invention.

FIG. 10 shows an example of a second specific configuration of the receiver unit connecting unit 20, that is referred to as a receiver unit connecting unit 20*b*, in the transmit/receive switch unit 2 of the present exemplary embodiment.

In the receiver unit connecting unit 20*b* shown in FIG. 10, FET 25 is arranged between the antenna 3 and LNA 6 for the receiver.

When the wireless communication apparatus is at the transmitting (Tx) period, the control signal Vcont is set to 'Low' At this time, since FET 25 is in the open state, impedance that is formed by viewing the receiver side from the end of the antenna becomes infinite in an ideal case. Therefore, the transmitted signal 5 provided by the switching amplification unit 1 is emitted from the antenna 3 with no leakage of the transmitted signal 5 to the receiver side. At this time, since there is no component to cause a loss between the switching amplification unit 1 and the antenna 3 as mentioned above, it is possible to carry out the transmitting with the high efficiency in the electric power usage.

When the wireless communication apparatus is at the receiving (Rx) period, the control signal Vcont is set to 'High'. At this time, since FET 25 is in the short-circuited state, input impedance of LNA can be directly viewed from the end of the antenna. Furthermore, by setting the switching elements 11 and 12 to be in the open state at the receiving (Rx) period as shown in FIG. 8, it is possible to keep the impedance, that is formed by viewing the transmitter side from the end of the antenna, high. Accordingly, it is possible to separate the received signal without arranging the transmit/receive switch unit between the antenna 3 and the switching amplifier for the transmitting.

Moreover, while the transmit/receive switch unit shown in FIG. 14 requires the SPDT (Single-pole Double-through) switch, the SPST (Single-pole Single-through) switch can be used in the present exemplary embodiment. In general, when the number of ports of a switch that includes FET or the like increases, a loss and distortion characteristics of the switch are degraded.

Furthermore, since the switching amplification unit 1 does not output any output signal at the receiving (Rx) period, the leakage of the electric power from the transmitter side to the receiver side does not exist in principle. Accordingly, in the case of the wireless communication apparatus of the present invention, it is possible to improve also the receiving characteristics in comparison with the apparatuses of PTLs 3 and 4

Here, while FIG. 10 shows the example with one stage of FETs, that are connected in series, as the configuration of the receiver unit connecting unit 20b using FET, multi-stage FETs may be used depending on the RF electric power to be used, and FET for shunt may be provided in order to enhance the isolation.

Moreover, while FIG. 10 shows the example of the wireless communication apparatus based on the TDD method that includes a pair of transmitter system and receiver system, the present exemplary embodiment is also applicable to a wireless communication apparatus based on another wireless method that uses a plurality of wireless communication methods or a plurality of RF carrier frequencies.

Third Exemplary Embodiment

[Configuration of Third Exemplary Embodiment]

Figure 11:
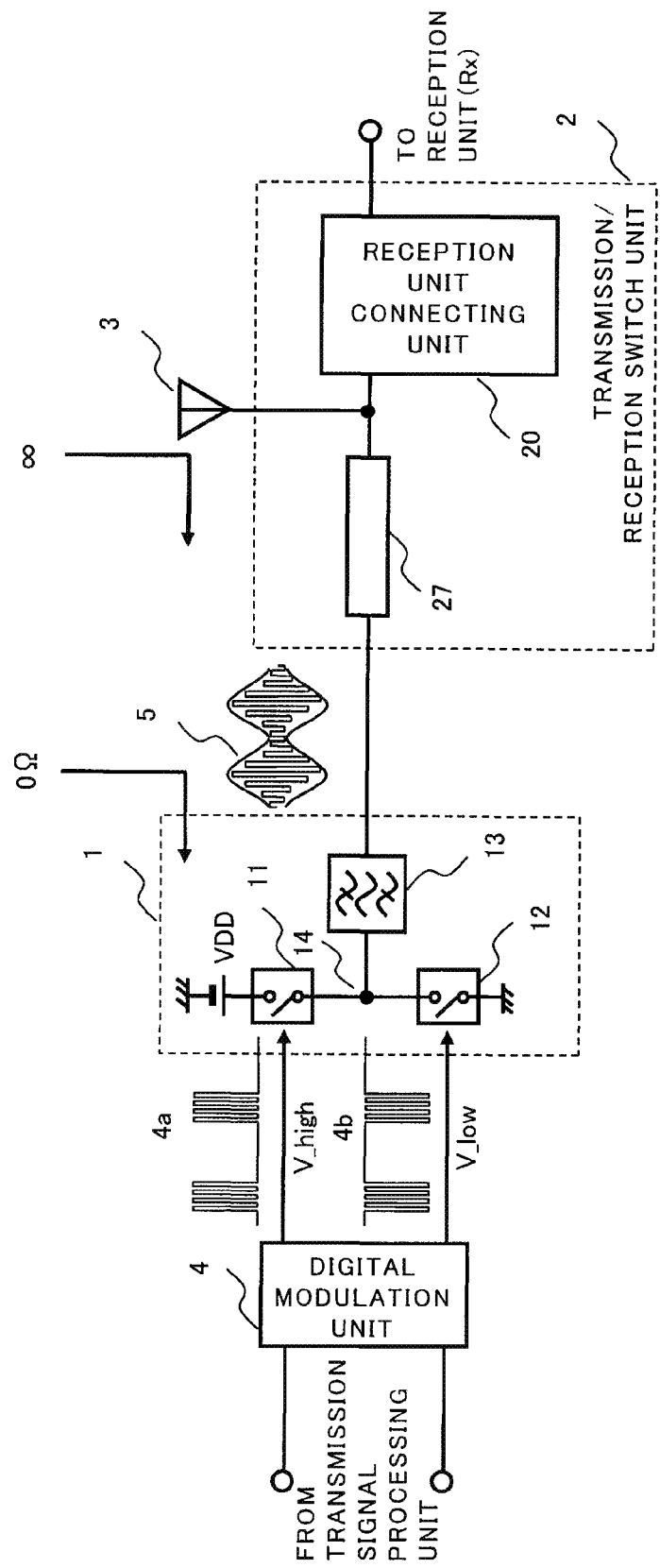
FIG. 11 is a block diagram showing a configuration of a wireless communication apparatus of a third exemplary embodiment of the present invention.
Figure 12:
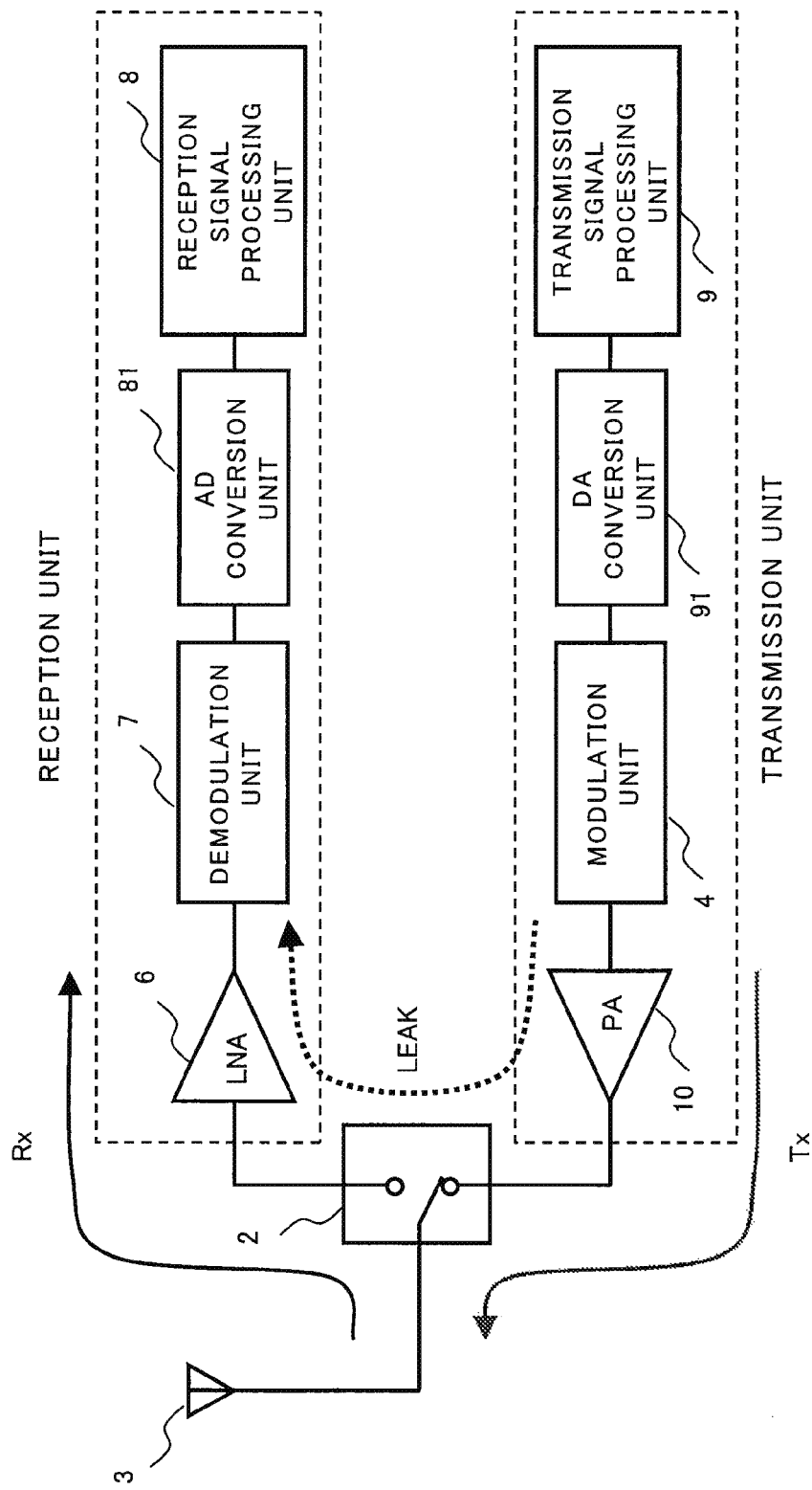
FIG. 12 is a block diagram showing a general configuration of a wireless apparatus based on the Time Division Duplex (TDD) method.

FIG. 11 is a block diagram showing a configuration of a wireless communication apparatus of a third exemplary embodiment of the present invention. In the case of the wireless communication apparatus of the present exemplary embodiment, the switching amplification unit 1 is connected with the antenna 3 through a transmission line 27.

Similarly to the wireless communication apparatuses of the first and the second exemplary embodiments, the wireless communication apparatus of the present exemplary embodiment includes the switching amplification unit 1, the transmit/receive switch unit 2, the antenna 3, the digital modulation unit 4, the filter 13 and the switching elements 11 and 12.

The switching amplification unit 1 includes two switching elements 11 and 12 that are arranged in a form of series-connection and connected between the electric power supply and the ground.

The digital modulation unit 4 receives input of data provided by a transmitting signal processing unit (not shown in the drawing), and outputs the switching amplifier control signals 4a and 4b that are complementary two-level pulse signals including information of the inputted data as time information. The switching amplifier control signals 4a and 4b are inputted into the switching amplification unit 1 to set the switching elements 11 and 12 to be in the conductive state and the non-conductive state respectively, or in the non-conductive state and the conductive state respectively. Accordingly, the pulse output terminal 14, which is arranged at the connection point of the switching element 11 and the switching element 12, outputs the pulse signal in which the amplitudes of the switching amplifier control signals 4a and 4b are amplified up to an electric power supply voltage VDD.

The filter 13 is connected with the pulse output terminal 14. The filter 13 removes harmonic components of the pulse signal that is amplified by the switching amplification unit 1. Then, the pulse signal is changed to the output signal 5 that is a RF carrier on which information of the original data is superimposed. An output of the filter 13 is connected with one terminal of the transmission line 27. The other terminal of the transmission line 27 is connected with the antenna 3 and the receiver unit connecting unit 20.

The transmit/receive switch unit 2 connects or disconnects the antenna 3 and the receiver unit.

An example of a more specific configuration of the switching amplification unit 1 is the same as the example shown in FIG. 2, and then explanation on the more specific configuration is omitted. An example of a more specific configuration of the digital modulation unit 4 is the same as the examples shown in FIG. 4 and FIG. 5, and then explanation on the more specific configuration is omitted. An example of a more specific configuration of the transmit/receive switch unit 2 is the same as the examples shown in FIG. 9 and FIG. 10, and then explanation on the more specific configuration is omitted.

[Effect of Third Exemplary Embodiment]

Similarly to the switching amplifier control signal in the first exemplary embodiment, an example of the switching amplifier control signal in the present exemplary embodiment is shown in FIG. 6.

At the transmitting (TX) period, the digital modulation unit 4 outputs the complementary two-level pulse signals, that is, the switching amplifier control signal 4a (V_high), and the switching amplifier control signal 4b (V_low). At the receiving (Rx) period, V_high is fixed to the 'Low' state and V_low is fixed to the 'High' state. In this case, the switching element (high-side FET) 11 and the switching element (low-side FET) 12 of the switching amplification unit 1 shown in FIG. 11 are set to be in the non-conductive state and the conductive state respectively to make the pulse output terminal 14 of the switching amplifier grounded, and consequently the RF output electric power disappears. That is, during the receiving, the leakage of the electric power from the transmitter side to the receiver side is not caused. Moreover, at the receiving (Rx) period, the waiting current of the transmitter side switching amplifier becomes zero and the electric power consumption is reduced.

Furthermore, according to the present exemplary embodiment, as a result of the low-side FET 12 entering into the conductive state at the receiving (Rx) period, impedance between an end of the filter and the ground terminal is almost short-circuited. By designing the impedance of the transmission line 27 seen from the end of the antenna to the transmission line 27 in such a way that it becomes almost open by adjusting the length of the transmission line 27, it is possible to completely separate the received signal. At this time, in comparison with the transmitter side switch units of PTLs 3 and 4, a loss of the wireless communication apparatus of the present exemplary embodiment is small since the diode 23 shown in FIG. 13 and FET 25 shown in FIG. 14 are not used. As a result, there is no component to cause a loss through a path from the switching amplification unit 1, that is corresponding to PA causing the largest influence of the electric power loss in the usual wireless communication apparatus, until the antenna 3, and consequently efficiency in the electric power consumption of the whole wireless communication apparatus is improved. The length of the transmission line 27 is close to a quarter wavelength of the RF carrier frequency in an ideal case, but it is possible to appropriately adjust the length.

According to the present exemplary embodiment, in order to realize to reduce the leakage of the electric power to the receiver side, and to make the waiting current zero, without using an additional switch component that is used for turning the collector voltage and the drain voltage on and off like the apparatuses of PTLs 3 and 4, it is possible to realize the reduction and the zero waiting current only by use of the switching amplifier control signals 4*a* and 4*b*. By virtue of the above mention, according to the present exemplary embodiment, it is possible to miniaturize the wireless communication apparatus and to lower a cost of the wireless communication apparatus. Furthermore, according to the present exemplary embodiment, it is possible to switch between the transmitter and the receiver at the same speed as ones of the switching amplifier control signals 4*a* and 4*b*.

Moreover, while the example shown in FIG. 11 is the example of the wireless communication apparatus based on the TDD method including a pair of the transmitter system and the receiver system, the present exemplary embodiment is applicable to a wireless communication apparatus based on another method that includes a plurality of wireless methods and a plurality of RF carrier frequencies.

While the exemplary embodiment of the present invention has been explained by the above mention, the present invention is not limited to the above-mentioned exemplary embodiments. Apparently, the present invention includes another modified example and an applied example.

A part of or a whole of the above-mentioned exemplary embodiments can be described like the following supplementary notes, but are not limited to the supplementary notes.

(Supplementary Note 1)

A transmitter/receiver apparatus, characterized in that:
the transmitter/receiver apparatus includes:
a transmitter/receiver terminal that is shared between transmitting of a transmitted signal and receiving of a received signal;
a switching amplifier that includes a low-side switching element connected between a ground terminal and a pulse output terminal, a high-side switching element connected between the pulse output terminal and an electric power supply terminal and a filter for passing a predetermined frequency component of a pulse signal and outputting the filtered pulse signal from a transmitter terminal as the transmitted signal, and that outputs the pulse signal from the pulse output terminal; and a transmit/receive switch unit that switches a connection status between the transmitter/receiver terminal and the transmitter terminal and also switches a connection status between the transmitter/receiver terminal and a receiver terminal inputting the received signal; and during the receiving, on the basis of the connection status between the transmitter/receiver terminal and the transmitter terminal, the low-side switching element and the high-side switching element are fixed to a conductive state and a non-conductive state respectively, to the non-conductive state and the conductive state respectively, or to the non-conductive state and the non-conductive state respectively.

(Supplementary Note 2)

The transmitter/receiver apparatus according to Supplementary note 1, characterized in that:
the transmit/receive switch unit connects the transmitter/receiver terminal and the transmitter terminal during the transmitting, and connects the transmitter/receiver terminal and the receiver terminal during the receiving; and
during the transmitting, the low-side switching element and the high-side switching element are set up to be in the conductive state and the non-conductive state respectively, or in the non-conductive state and the conductive state respectively on the basis of complementary two-level pulse input signals that are the transmitted signals, and during the receiving, the low-side switching element and the high-side switching element are fixed to the conductive state and the non-conductive state respectively, to the non-conductive state and the conductive state respectively, or to the non-conductive state and the non-conductive state respectively.

(Supplementary Note 3)

The transmitter/receiver apparatus according to Supplementary note 1, characterized in that:
the transmit/receive switch unit includes a receiver unit connecting unit that, during the transmitting, disconnects the transmitter/receiver terminal and the receiver terminal, and during the receiving, connects the transmitter/receiver terminal and the receiver terminal, and that always connects the transmitter/receiver terminal and the transmitter terminal; and
during the transmitting, the low-side switching element and the high-side switching element are set up to be in the conductive state and the non-conductive state respectively, or in the non-conductive state and the conductive state respectively on the basis of complementary two-level pulse input signals that are the transmitted signals, and during the receiving, the low-side switching element and the high-side switching element are fixed to the non-conductive state and the non-conductive state respectively.

(Supplementary Note 4)

The transmitter/receiver apparatus according to Supplementary note 3, characterized in that:
the receiver unit connecting unit has a switch circuit that includes a diode and a transmission line.

(Supplementary Note 5)

The transmitter/receiver apparatus according to Supplementary note 3, characterized in that:
the transmit/receive switch unit has a switch circuit that includes a field-effect transistor.

(Supplementary Note 6)

The transmitter/receiver apparatus according to any one of Supplementary notes 1 to 5, characterized in that:
the transmitter/receiver apparatus includes a first digital modulation unit including:
a first delta-sigma modulator that receives input of an I component out of the I component and a Q component of a wireless modulation signal, and converts the I component into an one-bit digital signal;

a second delta-sigma modulator that receive input of the Q component, and converts the Q component into an one-bit digital signal;

a clock generator that generates a second clock formed by repeating a three-level pattern of (0, 1, 0, −1) on the basis of a first clock signal;

a first mixer that multiplies an output of the first delta-sigma modulator and the second clock;

a second mixer that multiplies an output of the second delta-sigma modulator and a delayed second clock which is generated by delaying the second clock by one clock of the first clock signal; and an adder that adds an output of the first mixer and an output of the second mixer; and the low-side switching element and the high-side switching element are driven by an output signal of the adder, and a complementary signal of the output signal of the adder respectively.

(Supplementary Note 7)

The transmitter/receiver apparatus according to any one of Supplementary notes 1 to 5, characterized in that:

the transmitter/receiver apparatus includes a second digital modulation unit including:

a polar coordinate converter that receive input of an I component and a Q component of a wireless modulation signal which are orthogonal each other, and outputs an amplitude component and a phase component of the wireless communication signal;

a third delta-sigma modulator that converts the amplitude component into an one-bit digital signal;

an oscillator that outputs a carrier pulse which has a repetition frequency identical to a carrier frequency;

a third mixer that multiplies the phase component and an output of the oscillator; and a fourth mixer that multiplies an output of the third delta-sigma modulator and an output of the third mixer; and the low-side switching element and the high-side switching element are driven by an output signal of the fourth mixer, and a complementary signal of the output signal of the fourth mixer respectively.

(Supplementary Note 8)

The transmitter/receiver apparatus according to any one of Supplementary notes 1 to 7, characterized in that:

the transmit/receive switch unit switches between connection of the transmitter/receiver terminal with the transmitter terminal, and connection of the transmitter/receiver terminal with the receiver terminal at a predetermined time interval.

(Supplementary Note 9)

The transmitter/receiver apparatus according to any one of Supplementary notes 1 to 8, characterized by comprising:

an antenna that is connected with the transmitter/receiver terminal.

(Supplementary Note 10)

A transmitter apparatus, characterized in that:

the transmitter apparatus includes a switching amplifier that includes a low-side switching element connected between a ground terminal and a pulse output terminal and a high-side switching element connected between the pulse output terminal and an electric power supply terminal, and that outputs a pulse signal from the pulse output terminal; and in a transmitter/receiver device that transmits a transmitted signal generated from the pulse signal, and receives a received signal provided from the outside, during the receiving, at least one of the low-side switching element and the high-side switching element is fixed to a cut-off state.

(Supplementary Note 11)

The transmitter apparatus according to Supplementary note 10, characterized by comprising:

a filer that passes a predetermined frequency component of the pulse signal, and outputs the filtered pulse signal from a transmitter terminal as the transmitted signal.

(Supplementary Note 12)

A transmitting/receiving method, characterized in that:

the transmitting/receiving method, that is used in a transmitter/receiver apparatus including:

a transmitter/receiver terminal that is shared between transmitting of a transmitted signal and receiving of a received signal;

a switching amplifier that includes a low-side switching element connected between a ground terminal and a pulse output terminal and a high-side switching element connected between the pulse output terminal and an electric power supply terminal and that outputs a pulse signal from the pulse output terminal;

a filter that passes a predetermined frequency component of the pulse signal and outputs the filtered pulse signal as the transmitted signal from a transmitter terminal; and a transmit/receive switch unit that switches a connection status between the transmitter/receiver terminal and the transmitter terminal and also switches a connection status between the transmitter/receiver terminal and a receiver terminal inputting the received signal, comprises:

fixing the low-side switching element and the high-side switching element to a conductive state and a non-conductive state respectively, to the non-conductive state and the conductive state respectively or to the non-conductive state and the non-conductive state respectively on the basis of the connection status between the transmitter/receiver terminal and the transmitter terminal during the receiving.

This application is based upon and claims the benefit of priority from Japanese Patent Application No. 2013-218937, filed on Oct. 22, 2015, the disclosure of which is incorporated herein in its entirety by reference.

INDUSTRIAL APPLICABILITY

The present invention is applicable to general communication apparatuses of a wireless type and a wire type that carry out switch between the transmitting operation and the receiving operation. For example, the present invention is applicable to a wireless communication apparatus such as a mobile terminal, a base station or the like that carries out wireless communication based on the TDD method.

REFERENCE SIGNS LIST 1 switching amplification unit
2 transmit/receive switch unit
3 antenna
4 digital modulation unit
4a switching amplifier control signal (V_high)
4b switching amplifier control signal (V_low)
5 transmitted signal
6 low noise amplifier (LNA)
7 demodulation unit
8 received signal processing unit 9 transmitting signal processing unit
10 high-level output amplifier (PA)
11 switching element (high-side FET)
12 switching element (low-side FET)
13 filter
14 pulse output terminal
20, 20a and 20b receiver unit connecting unit
21 and 23 diode
22 quarter wavelength transmission line
24 anode terminal
25 and 26 FET
27 transmission line
41, 41a and 41b delta-sigma modulator
42a and 42b mixer
43a amplitude pulse signal
43b phase modulation signal
44 clock
45 oscillator
46 polar coordinate converter
47 adder
48 delay device
49 clock generator
81 AD conversion unit
91 DA conversion unit
131 inductor
132 capacitor

The invention claimed is:

1. A transmitter/receiver apparatus, comprising:
a transmitter/receiver terminal that is shared between transmitting of a transmitted signal and receiving of a received signal;
a switching amplifier that includes a low-side switching element connected between a ground terminal and a pulse output terminal, a high-side switching element connected between the pulse output terminal and an electric power supply terminal, and a filter for passing a predetermined frequency component of a pulse signal and outputting the pulse signal filtered from a transmitter terminal as the transmitted signal, and that outputs the pulse signal from the pulse output terminal; and
a transmit/receive switch unit that switches a connection status between the transmitter/receiver terminal and the transmitter terminal and switches a connection status between the transmitter/receiver terminal and a receiver terminal for receiving input of the received signal; and
during the receiving, based on the connection status between the transmitter/receiver terminal and the transmitter terminal, the low-side switching element and the high-side switching element are respectively fixed to a conductive state and a non-conductive state, to the non-conductive state and the conductive state, or to the non-conductive state and the non-conductive state.

2. The transmitter/receiver apparatus according to claim 1, wherein:
the transmit/receive switch unit connects the transmitter/receiver terminal and the transmitter terminal during the transmitting, and connects the transmitter/receiver terminal and the receiver terminal during the receiving; and
during the transmitting, the low-side switching element and the high-side switching element are set up to be in the conductive state and the non-conductive state respectively, or in the non-conductive state and the conductive state respectively based on complementary two-level pulse input signals that form the transmitted signal, and during the receiving, the low-side switching element and the high-side switching element are fixed to the conductive state and the non-conductive state respectively, to the non-conductive state and the conductive state respectively, or to the non-conductive state and the non-conductive state respectively.

3. The transmitter/receiver apparatus according to claim 1, wherein:
the transmit/receive switch unit includes a receiver unit connecting unit that, during the transmitting, disconnects the transmitter/receiver terminal and the receiver terminal, and during the receiving, connects the transmitter/receiver terminal and the receiver terminal, and that consistently connects the transmitter/receiver terminal and the transmitter terminal; and
during the transmitting, the low-side switching element and the high-side switching element are set up to be in the conductive state and the non-conductive state respectively, or in the non-conductive state and the conductive state respectively based on complementary two-level pulse input signals that form the transmitted signal, and during the receiving, the low-side switching element and the high-side switching element are fixed to the non-conductive state and the non-conductive state, respectively.

4. The transmitter/receiver apparatus according to claim 3, wherein:
the receiver unit connecting unit includes a switch circuit that includes a diode and a transmission line.

5. The transmitter/receiver apparatus according to claim 3, wherein:
the transmit/receive switch unit has a switch circuit that includes a field-effect transistor.

6. The transmitter/receiver apparatus according to claim 1, further comprising:
a first digital modulation unit including:
a first delta-sigma modulator that receives input of an I component out of the I component and a Q component of a wireless modulation signal, and converts the I component into an one-bit digital signal, the I component and the Q component being orthogonal to each other;
a second delta-sigma modulator that receives input of the Q component, and converts the Q component into an one-bit digital signal;
a clock generator that generates a second clock signal formed by repeating a three-level pattern of (0, 1, 0, −1) based on a first clock signal;
a first mixer that multiplies an output of the first delta-sigma modulator by the second clock;
a second mixer that multiplies an output of the second delta-sigma modulator by a delayed second clock which is generated by delaying the second clock by one clock of the first clock signal; and
an adder that adds an output of the first mixer and an output of the second mixer; and
the low-side switching element and the high-side switching element are driven by an output signal of the adder, and a complementary signal of the output signal of the adder, respectively.

7. The transmitter/receiver apparatus according to claim 1, further comprising:
a second digital modulation unit including:
a polar coordinate converter that receives input of an I component and a Q component of a wireless modulation signal which are orthogonal to each other, and outputs an amplitude component and a phase component of the wireless communication signal;
a third delta-sigma modulator that converts the amplitude component into an one-bit digital signal;
an oscillator that outputs a carrier pulse which has a repetition frequency identical to a carrier frequency;
a third mixer that multiplies the phase component by an output of the oscillator; and
a fourth mixer that multiplies an output of the third delta-sigma modulator by an output of the third mixer; and
the low-side switching element and the high-side switching element are driven by an output signal of the fourth mixer, and a complementary signal of the output signal of the fourth mixer respectively.

8. The transmitter/receiver apparatus according to claim 1, further comprising:
an antenna that is connected with the transmitter/receiver terminal.

9. The transmitter/receiver apparatus according to claim 1, wherein:
the transmit/receive switch unit switches between connection of the transmitter/receiver terminal with the transmitter terminal, and connection of the transmitter/receiver terminal with the receiver terminal at a predetermined time interval.

10. A transmitter apparatus, comprising:
a switching amplifier that includes a low-side switching element connected between a ground terminal and a pulse output terminal and a high-side switching element connected between the pulse output terminal and an electric power supply terminal, and that outputs a pulse signal from the pulse output terminal; and
a filter that passes a predetermined frequency component of the pulse signal, and outputs a filtered pulse signal from a transmitter terminal as a transmitted signal, wherein
in a transmitter/receiver device that transmits the transmitted signal generated from the pulse signal, and receives a received signal from outside, during the receiving, at least one of the low-side switching element and the high-side switching element is fixed to a cut-off state.

11. The transmitter apparatus according to claim 10, further comprising:
a first digital modulation unit including:
a first delta-sigma modulator that receives input of an I component out of the I component and a Q component of a wireless modulation signal, and converts the I component into an one-bit digital signal;
a second delta-sigma modulator that receives input of the Q component, and converts the Q component into an one-bit digital signal;
a clock generator that generates a second clock formed by repeating a three-level pattern of (0, 1, 0, −1) on the basis of a first clock signal;
a first mixer that multiplies an output of the first delta-sigma modulator and the second clock;
a second mixer that multiplies an output of the second delta-sigma modulator and a delayed second clock which is generated by delaying the second clock by one clock of the first clock signal; and
an adder that adds an output of the first mixer and an output of the second mixer, wherein the low-side switching element and the high-side switching element are driven by an output signal of the adder, and a complementary signal of the output signal of the adder respectively.

12. The transmitter apparatus according to claim 10, further comprising:
a second digital modulation unit including:
a polar coordinate converter that receives input of an I component and a Q component of a wireless modulation signal which are orthogonal each other, and outputs an amplitude component and a phase component of the wireless communication signal;
a third delta-sigma modulator that converts the amplitude component into an one-bit digital signal;
an oscillator that outputs a carrier pulse which has a repetition frequency identical to a carrier frequency;
a third mixer that multiplies the phase component and an output of the oscillator; and
a fourth mixer that multiplies an output of the third delta-sigma modulator and an output of the third mixer, wherein
the low-side switching element and the high-side switching element are driven by an output signal of the fourth mixer, and a complementary signal of the output signal of the fourth mixer respectively.

13. A transmitting/receiving method that is used in a transmitter/receiver apparatus including:
a transmitter/receiver terminal that is shared between transmitting of a transmitted signal and receiving of a received signal;
a switching amplifier that includes a low-side switching element connected between a ground terminal and a pulse output terminal and a high-side switching element connected between the pulse output terminal and an electric power supply terminal and that outputs a pulse signal from the pulse output terminal;
a filter that passes a predetermined frequency component of the pulse signal and outputs the filtered pulse signal as the transmitted signal from a transmitter terminal; and
a transmit/receive switch unit that switches a connection status between the transmitter/receiver terminal and the transmitter terminal and also switches a connection status between the transmitter/receiver terminal and a receiver terminal inputting the received signal, the transmitting/receiving method comprising:
fixing the low-side switching element and the high-side switching element to a conductive state and a non-conductive state respectively, to the non-conductive state and the conductive state respectively or to the non-conductive state and the non-conductive state respectively based on the connection status between the transmitter/receiver terminal and the transmitter terminal during the receiving.

14. The transmitting/receiving method according to claim 13, further comprising:
connecting the transmitter/receiver terminal and the transmitter terminal during the transmitting;
connecting the transmitter/receiver terminal and the receiver terminal during the receiving;
during the transmitting, setting up the low-side switching element and the high-side switching element to be in the conductive state and the non-conductive state respectively, or in the non-conductive state and the conductive state respectively on the basis of complementary two-level pulse input signals that are the transmitted signals; and during the receiving, fixing the low-side switching element and the high-side switching element to the conductive state and the non-conductive state respectively, to the non-conductive state and the conductive state respectively, or to the non-conductive state and the non-conductive state respectively.

15. The transmitting/receiving method according to claim 13, further comprising:
during the transmitting, disconnecting the transmitter/receiver terminal and the receiver terminal;
during the receiving, connecting the transmitter/receiver terminal and the receiver terminal;
always connecting the transmitter/receiver terminal and the transmitter terminal;
during the transmitting, setting up the low-side switching element and the high-side switching element to be in the conductive state and the non-conductive state respectively, or in the non-conductive state and the conductive state respectively on the basis of complementary two-level pulse input signals that are the transmitted signals; and
during the receiving, fixing the low-side switching element and the high-side switching element to the non-conductive state and the non-conductive state respectively.

16. The transmitting/receiving method according to claim 13, wherein:
switching between connection of the transmitter/receiver terminal with the transmitter terminal, and connection of the transmitter/receiver terminal with the receiver terminal at a predetermined time interval.

17. The transmitting/receiving method according to claim 13, further comprising:
receiving input of an I component out of the I component and a Q component of a wireless modulation signal;
converting the I component into an first one-bit digital signal;
receiving input of the Q component;
converting the Q component into an second one-bit digital signal;
generating a second clock formed by repeating a three-level pattern of (0, 1, 0, -1) on the basis of a first clock signal;
multiplying the first one-bit digital signal by the second clock into a first output;
multiplying the second one-bit digital signal by a delayed second clock into a second output, the delayed second clock being generated by delaying the second clock by one clock of the first clock signal;
adding the first output and the second output into an added output signal; and
driving the low-side switching element and the high-side switching element by the added output signal, and a complementary signal of the added output signal respectively.

18. The transmitting/receiving method according to claim 13, further comprising:
receiving input of an I component and a Q component of a wireless modulation signal which are orthogonal each other;
outputting an amplitude component and a phase component of the wireless communication signal;
converting the amplitude component into an one-bit digital signal;
outputting a carrier pulse which has a repetition frequency identical to a carrier frequency;
multiplying the phase component by the carrier pulse into a third output;
multiplying the one-bit digital signal by the third output into a fourth output signal; and
driving the low-side switching element and the high-side switching element by the fourth output signal, and a complementary signal of the fourth output signal, respectively.

\* \* \* \* \*